United States Patent
Hioka et al.

(10) Patent No.: US 11,810,629 B2
(45) Date of Patent: Nov. 7, 2023

(54) SEMICONDUCTOR MEMORY DEVICE

(71) Applicant: KIOXIA CORPORATION, Tokyo (JP)

(72) Inventors: Takeshi Hioka, Machida Tokyo (JP); Toshifumi Watanabe, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/899,971

(22) Filed: Aug. 31, 2022

(65) Prior Publication Data

US 2023/0317184 A1    Oct. 5, 2023

(30) Foreign Application Priority Data

Mar. 31, 2022 (JP) .................. 2022-059354

(51) Int. Cl.
*G11C 16/10* (2006.01)
*G11C 16/34* (2006.01)
*G11C 7/06* (2006.01)

(52) U.S. Cl.
CPC ............ *G11C 16/3459* (2013.01); *G11C 7/06* (2013.01); *G11C 16/102* (2013.01); *G11C 16/3404* (2013.01)

(58) Field of Classification Search
CPC ..... G11C 16/3459; G11C 7/06; G11C 16/102; G11C 16/3404
See application file for complete search history.

(56) References Cited

U.S. PATENT DOCUMENTS

| 2014/0119126 A1* | 5/2014 | Dutta ..................... G11C 16/10 |
| | | 365/185.19 |
| 2020/0202956 A1 | 6/2020 | Deguchi et al. |
| 2021/0090661 A1 | 3/2021 | Sako |
| 2023/0162809 A1* | 5/2023 | Prakash ............. G11C 16/0483 |
| | | 365/185.22 |

FOREIGN PATENT DOCUMENTS

| JP | 2020-102291 A | 7/2020 |
| JP | 2021-047953 A | 3/2021 |

* cited by examiner

*Primary Examiner* — Xiaochun L Chen

(74) *Attorney, Agent, or Firm* — Kim & Stewart LLP

(57) ABSTRACT

A semiconductor memory device includes a memory cell array including a plurality of memory cells, a word line connected to the plurality of memory cells, a plurality of bit lines connected respectively to the plurality of memory cells, a sense amplifier connected to the plurality of bit lines, and a controller configured to execute a write operation in a plurality of program loops each including a program operation and a verify operation. The sense amplifier is configured to apply a first voltage, a second voltage higher than the first voltage, a third voltage higher than the second voltage, and a fourth voltage higher than the third voltage to first, second, third, and fourth bit lines of the plurality of bit lines, respectively, while a program voltage is applied to the word line in the program operation.

20 Claims, 21 Drawing Sheets

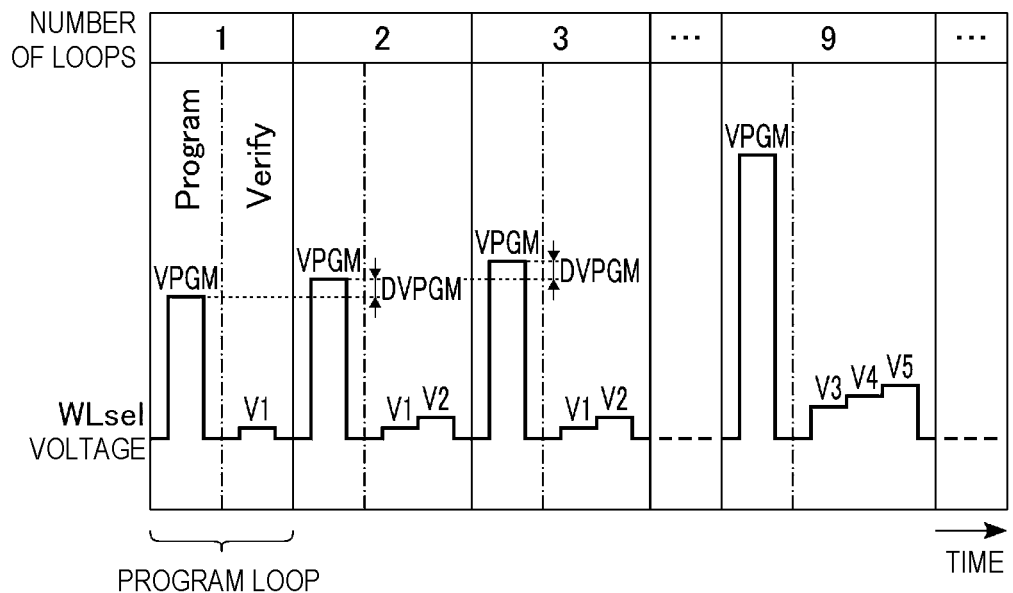

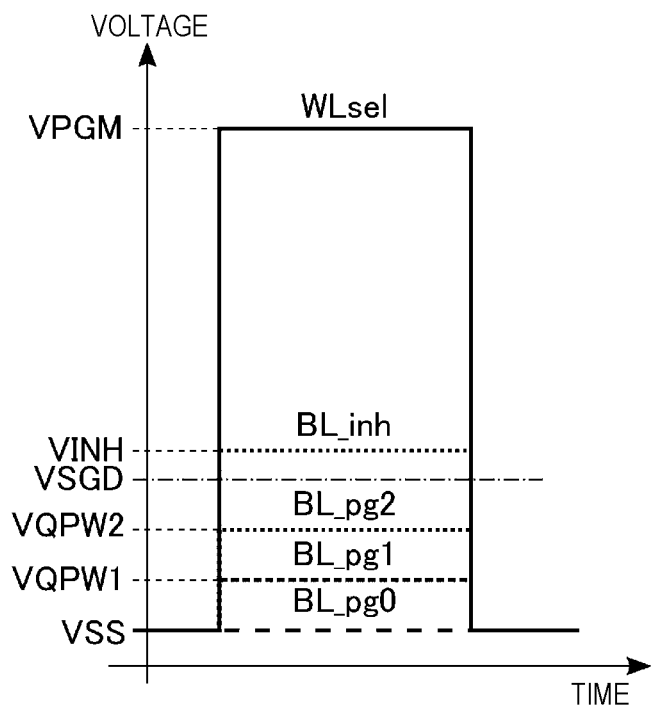

FIG. 21

| WRITE STATE | VERIFY VOLTAGE | | |
|---|---|---|---|
| | VL1 | VL2 | VH |
| "S1" STATE | – | V1L2 | V1 |
| "S2" STATE | – | V2L2 | V2 |
| "S3" STATE | – | V3L2 | V3 |
| "S4" STATE | V3 | V4L2 | V4 |
| "S5" STATE | V4 | V5L2 | V5 |
| "S6" STATE | V5 | V6L2 | V6 |
| "S7" STATE | V6 | V7L2 | V7 |

FIG. 23

| WRITE STATE | VERIFY VOLTAGE | | |
|---|---|---|---|
| | VL1 | VL2 | VH |
| "S1" STATE | V1L1 | V1L2 | V1 |
| "S2" STATE | V2L1 | V2L2 | V2 |
| "S3" STATE | V3L1 | V3L2 | V3 |
| "S4" STATE | V4L1 | V4L2 | V4 |
| "S5" STATE | V5L1 | V5L2 | V5 |
| "S6" STATE | V6L1 | V6L2 | V6 |
| "S7" STATE | V7L1 | V7L2 | V7 |

SEMICONDUCTOR MEMORY DEVICE

CROSS-REFERENCE TO RELATED APPLICATION(S)

This application is based upon and claims the benefit of priority from Japanese Patent Application No. 2022-059354, filed Mar. 31, 2022, the entire contents of which are incorporated herein by reference.

FIELD

Embodiments described herein relate generally to a semiconductor memory device.

BACKGROUND

A NAND type flash memory is known as a semiconductor memory device.

DESCRIPTION OF THE DRAWINGS

FIG. 7 is a timing chart illustrating an example of a write operation in the semiconductor memory device according to the first embodiment.

FIG. 8 is a table illustrating an example of setting a program loop in the semiconductor memory device according to the first embodiment.

FIG. 11 is a timing chart illustrating the voltage of a word line and the voltage of a bit line in a program operation in the semiconductor memory device according to the first embodiment.

FIG. 12 is a table illustrating an example of different verify voltages that are set in the semiconductor memory device according to the first embodiment.

FIG. 21 is a table illustrating an example of different verify voltages that are set in the semiconductor memory device according to a first example of a second embodiment.

FIG. 23 is a table illustrating an example of different verify voltages that are set in the semiconductor memory device according to a second example of the second embodiment.

DETAILED DESCRIPTION

Figure 1:
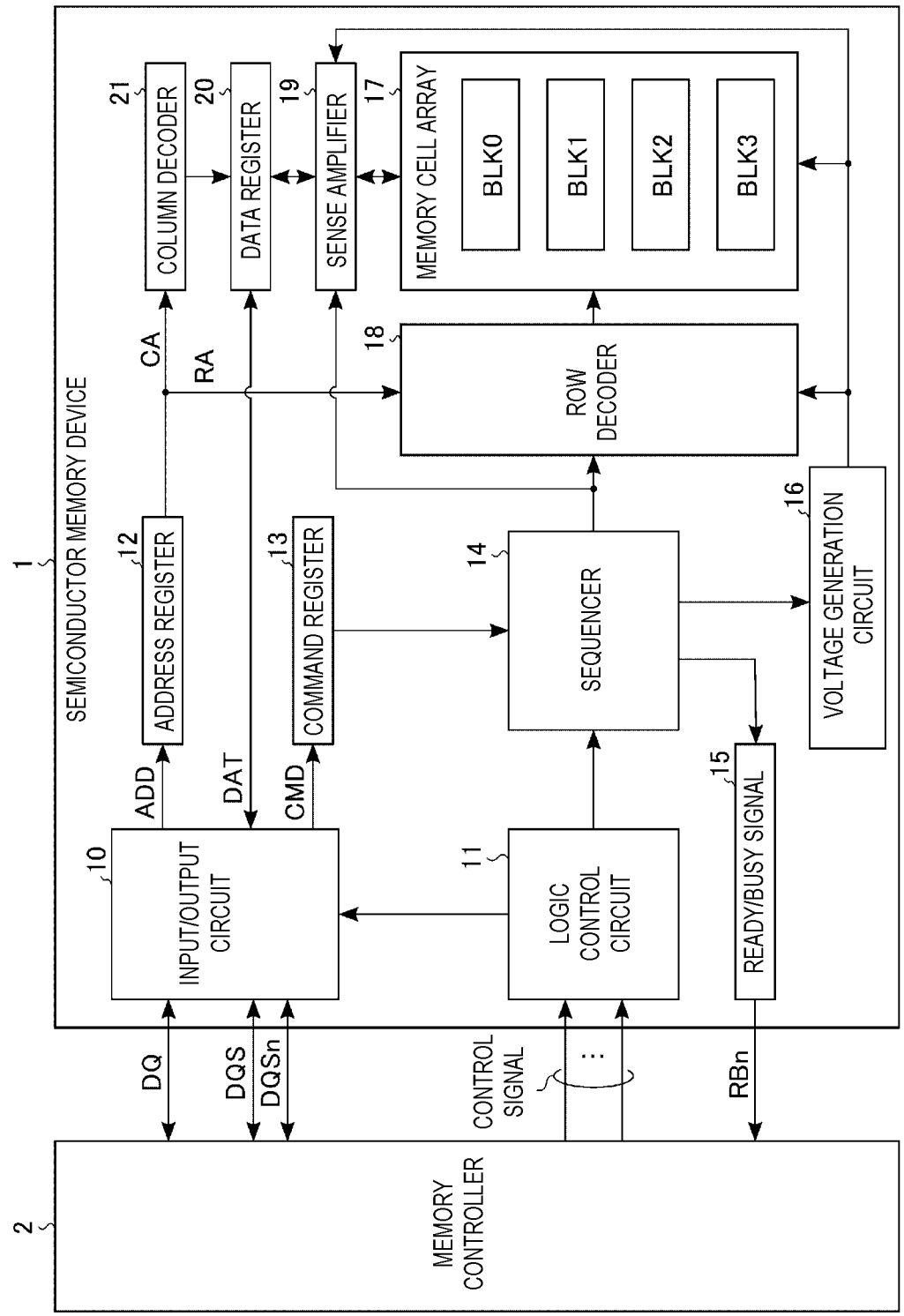
FIG. 1 is a block diagram illustrating an overall configuration of a semiconductor memory device according to a first embodiment.

Embodiments provide a semiconductor memory device with improved reliability.

In general, according to one embodiment, a semiconductor memory device includes a memory cell array including a plurality of memory cells, a word line connected to the plurality of memory cells, a plurality of bit lines connected respectively to the plurality of memory cells, a sense amplifier connected to the plurality of bit lines, and a controller configured to execute a write operation in a plurality of program loops each including a program operation and a verify operation. The sense amplifier is configured to apply a first voltage, a second voltage higher than the first voltage, a third voltage higher than the second voltage, and a fourth voltage higher than the third voltage to first, second, third, and fourth bit lines of the plurality of bit lines, respectively, while a program voltage is applied to the word line in the program operation.

Hereinafter, embodiments will be described with reference to the drawings. In this description, the same reference numerals will be given to components having substantially the same functions and configurations. Further, each embodiment illustrated below exemplifies an apparatus or method for embodying the technical idea of this embodiment, and the technical idea of the embodiment is not limited by the materials, shapes, structures, and arrangements of components described below. The technical idea of the embodiment may be modified in various ways within the scope of the claims.

1. First Embodiment

A semiconductor memory device 1 according to a first embodiment will be described. The semiconductor memory device 1 is a NAND type flash memory capable of storing data in a non-volatile manner. Hereinafter, the semiconductor memory device 1 according to the first embodiment will be described. The semiconductor memory device 1 is not limited to the NAND type flash memory. The semiconductor memory device 1 may be any other non-volatile memory.

1.1. Configuration

1.1.1 Overall Configuration of Semiconductor Memory Device

First, an example of an overall configuration of the semiconductor memory device will be described with reference to FIG. 1. FIG. 1 is a block diagram illustrating a basic overall configuration of a semiconductor memory device. In FIG. 1, a part of the connection of each component is illustrated by the arrow line, but the connection between components is not limited thereto.

As illustrated in FIG. 1, the semiconductor memory device 1 is configured to be controllable by an external memory controller 2. For example, the semiconductor memory device 1 transmits and receives a signal DQ and timing signals DQS and DQSn to and from the memory controller 2. The signal DQ is, for example, data DAT, an address ADD, or a command CMD. The timing signals DQS and DQSn are timing signals used for the input/output of the data DAT. The timing signal DQSn is an inverted signal of the timing signal DQS.

Further, the semiconductor memory device 1 receives various control signals from the memory controller 2. Then, the semiconductor memory device 1 transmits a ready/busy signal RBn to the memory controller 2. The ready/busy signal RBn is a signal indicating whether the semiconductor memory device 1 is in a busy state not capable of receiving the command CMD from the memory controller 2 or in a ready state capable of receiving the command CMD.

The semiconductor memory device 1 includes an input/output circuit 10, a logic control circuit 11, an address register 12, a command register 13, a sequencer 14, a ready/busy circuit 15, a voltage generation circuit 16, a memory cell array 17, a row decoder 18, a sense amplifier 19, a data register 20, and a column decoder 21.

The input/output circuit 10 is a circuit that inputs or outputs the signal DQ. The input/output circuit 10 is connected to the memory controller 2. Further, the input/output circuit 10 is connected to the logic control circuit 11, the address register 12, the command register 13, and the data register 20.

When the input signal DQ is the address ADD, the input/output circuit 10 transmits the address ADD to the address register 12. Further, when the input signal DQ is the command CMD, the input/output circuit 10 transmits the command CMD to the command register 13.

When the input signal DQ is the data DAT, the input/output circuit 10 receives the input signal DQ based on the timing signals DQS and DQSn. Then, the input/output circuit 10 transmits the data DAT to the data register 20. Further, the input/output circuit 10 outputs the data DAT to the memory controller 2 together with the timing signals DQS and DQSn.

The logic control circuit 11 is a circuit that performs logic control based on a control signal. The logic control circuit 11 is connected to the memory controller 2. Further, the logic control circuit 11 is connected to the input/output circuit 10 and the sequencer 14. The logic control circuit 11 receives a plurality of control signals from the memory controller 2. The logic control circuit 11 controls the input/output circuit 10 and the sequencer 14 based on the received control signal.

The address register 12 is a register that temporarily stores the address ADD. The address register 12 is connected to the input/output circuit 10, the row decoder 18, and the column decoder 21. The address ADD includes a row address RA and a column address CA. The address register 12 transfers the row address RA to the row decoder 18. Further, the address register 12 transfers the column address CA to the column decoder 21.

The command register 13 is a register that temporarily stores the command CMD. The command register 13 is connected to the input/output circuit 10 and the sequencer 14. The command register 13 transfers the command CMD to the sequencer 14.

The sequencer 14 is a control circuit that controls the semiconductor memory device 1. The sequencer 14 controls an operation of the entire semiconductor memory device 1. The sequencer 14 may function as a controller of the semiconductor memory device 1. For example, the sequencer 14 controls the ready/busy circuit 15, the voltage generation circuit 16, the row decoder 18, the sense amplifier 19, the data register 20, and the column decoder 21. For example, the sequencer 14 executes a write operation, a read operation, and an erase operation based on the command CMD.

The ready/busy circuit 15 is a circuit that transmits the ready/busy signal RBn to the memory controller 2.

The voltage generation circuit 16 generates voltages used for a write operation, a read operation, and an erase operation based on the control of the sequencer 14. The voltage generation circuit 16 supplies the generated voltages to the memory cell array 17, the row decoder 18, and the sense amplifier 19. The row decoder 18 and the sense amplifier 19 may apply the voltage supplied from the voltage generation circuit 16 to the memory cell array 17.

The memory cell array 17 is a set of a plurality of memory cell transistors (also simply referred to as "memory cells") arranged in a matrix. The memory cell array 17 includes a plurality of blocks BLK. In the example illustrated in FIG. 1, the memory cell array 17 includes four blocks BLK0, BLK1, BLK2, and BLK3. The number of blocks BLK in the memory cell array 17 may be chosen freely. The block BLK is, for example, a set of a plurality of memory cell transistors, data of which data is collectively erased. That is, the block BLK is the data erase unit. Details of a configuration of the block BLK will be described later.

The row decoder 18 is a decode circuit of the row address RA. The row decoder 18 selects one block BLK in the memory cell array 17 based on the decode result. The row decoder 18 applies a voltage to wirings in the row direction (word lines and select gate lines to be described later) of the selected block BLK.

The sense amplifier 19 is a circuit that writes and reads out the data DAT. The sense amplifier 19 is connected to the memory cell array 17 and the data register 20. The sense amplifier 19 reads out the data DAT from the memory cell array 17 during a read operation. Further, the sense amplifier 19 supplies a voltage based on the write data DAT and the threshold voltage of the memory cell transistor to the memory cell array 17 during a write operation. For example, the sense amplifier 19 may generate four voltages in a write operation based on write data and the threshold voltage of the memory cell transistor. Then, the sense amplifier 19 may apply any one of the four voltages to wirings in the column direction (which are bit lines to be described later).

The data register 20 is a register that temporarily stores the data DAT. The data register 20 is connected to the sense amplifier 19 and the column decoder 21. The data register 20 includes a plurality of latch circuits. Each latch circuit temporarily stores write data or read data.

The column decoder 21 is a circuit that decodes the column address CA. The column decoder 21 receives the column address CA from the address register 12. The column decoder 21 selects the latch circuit in the data register 20 based on the decode result of the column address CA.

1.1.2 Circuit Configuration of Memory Cell Array

Figure 2:
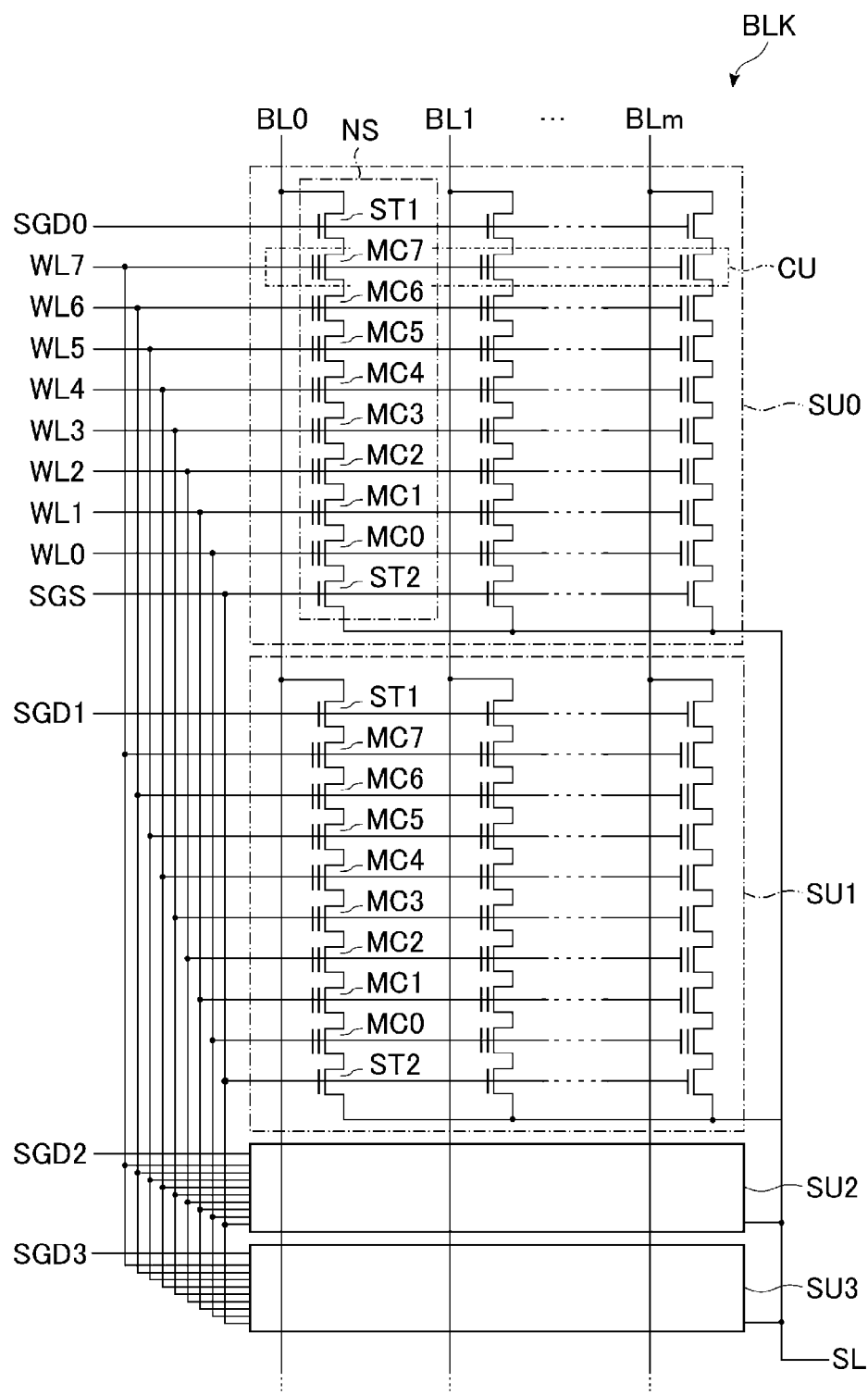
FIG. 2 is a circuit diagram of a memory cell array provided in the semiconductor memory device according to the first embodiment.

Next, an example of a circuit configuration of the memory cell array 17 will be described with reference to FIG. 2. FIG. 2 is a circuit diagram of the memory cell array 17.

The block BLK includes, for example, four string units SU0 to SU3. The number of string units SU provided in the block BLK may be chosen freely. The string unit SU is, for example, a set of a plurality of NAND strings NS collectively selected in a write operation or a read operation.

Next, an internal configuration of the string unit SU will be described. The string unit SU includes the plurality of NAND strings NS. The NAND string NS is a set of a plurality of memory cell transistors connected in series. Each of the plurality of NAND strings NS in the string unit SU is connected to one of bit lines BL0 to BLm (m is an integer of 1 or more).

Next, an internal configuration of the NAND string NS will be described. Each NAND string NS includes a plurality of memory cell transistors MC as well as select transistors ST1 and ST2. In the example illustrated in FIG. 2, the NAND string NS includes eight memory cell transistors MC0 to MC7.

The memory cell transistor MC is a memory element that stores data in a non-volatile manner. The memory cell transistor MC includes a control gate and a charge storage layer. The memory cell transistor MC may be a metal-oxide-nitride-oxide-silicon (MONOS) type in which an insulator is used for the charge storage layer, or may be a floating gate (FG) type in which a conductor is used for the charge storage layer.

The select transistors ST1 and ST2 are switching elements. The select transistors ST1 and ST2 are used respectively for selecting the string unit SU during various operations.

The current paths of the select transistor ST2, the memory cell transistors MC0 to MC7, and the select transistor ST1 in the NAND string NS are connected in series. The drain of the select transistor ST1 is connected to a bit line BL. The source of the select transistor ST2 is connected to a source line SL.

The control gates of the memory cell transistors MC0 to MC7 of the same block BLK are connected in common to word lines WL0 to WL7, respectively. More specifically, for example, the block BLK includes four string units SU0-SU3. Then, each string unit SU includes a plurality of memory cell transistors MC0. The control gates of the plurality of memory cell transistors MC0 in the block BLK are connected in common to one word line WL0. This description is equally applicable to the memory cell transistors MC1 to MC7.

The gates of a plurality of select transistors ST1 in the string unit SU are connected in common to one select gate line SGD. More specifically, the gates of a plurality of select transistors ST1 in the string unit SU0 are connected in common to a select gate line SGD0. The gates of a plurality of select transistors ST1 in the string unit SU1 are connected in common to a select gate line SGD1. The gates of a plurality of select transistors ST1 in the string unit SU2 are connected in common to a select gate line SGD2. The gates of a plurality of select transistors ST1 in the string unit SU3 are connected in common to a select gate line SGD3.

The gates of a plurality of select transistors ST2 in the block BLK are connected in common to a select gate line SGS. Alternatively, the select gate line SGS may be provided separately for each string unit SU in the same manner as the select gate line SGD.

The word lines WL0 to WL7, the select gate lines SGD0 to SGD3, and the select gate line SGS are connected to the row decoder 18, respectively.

The bit line BL is connected in common to one NAND string NS of each of the plurality of string units SU of each block BLK. Each bit line BL is connected to the sense amplifier 19.

The source line SL is shared, for example, across the plurality of blocks BLK.

A set of a plurality of memory cell transistors MC connected to a common word line WL in one string unit SU is expressed as, for example, "cell unit CU". In other words, the cell unit CU is a set of a plurality of memory cell transistors MC that are selected as a unit in a write operation or a read operation. A page is the unit of data that is collectively written (or collectively read out) to the cell unit CU. For example, when the memory cell transistor MC stores 1-bit data, the storage capacity of the cell unit CU is 1 page. The cell unit CU may have a storage capacity of two or more pages based on the number of bits of data stored in the memory cell transistor MC. Hereinafter, a case where the memory cell transistor MC is a Triple Level Cell (TLC) that stores 3-bit data will be described.

1.1.3 Configuration of Data Register and Sense Amplifier

Figure 3:
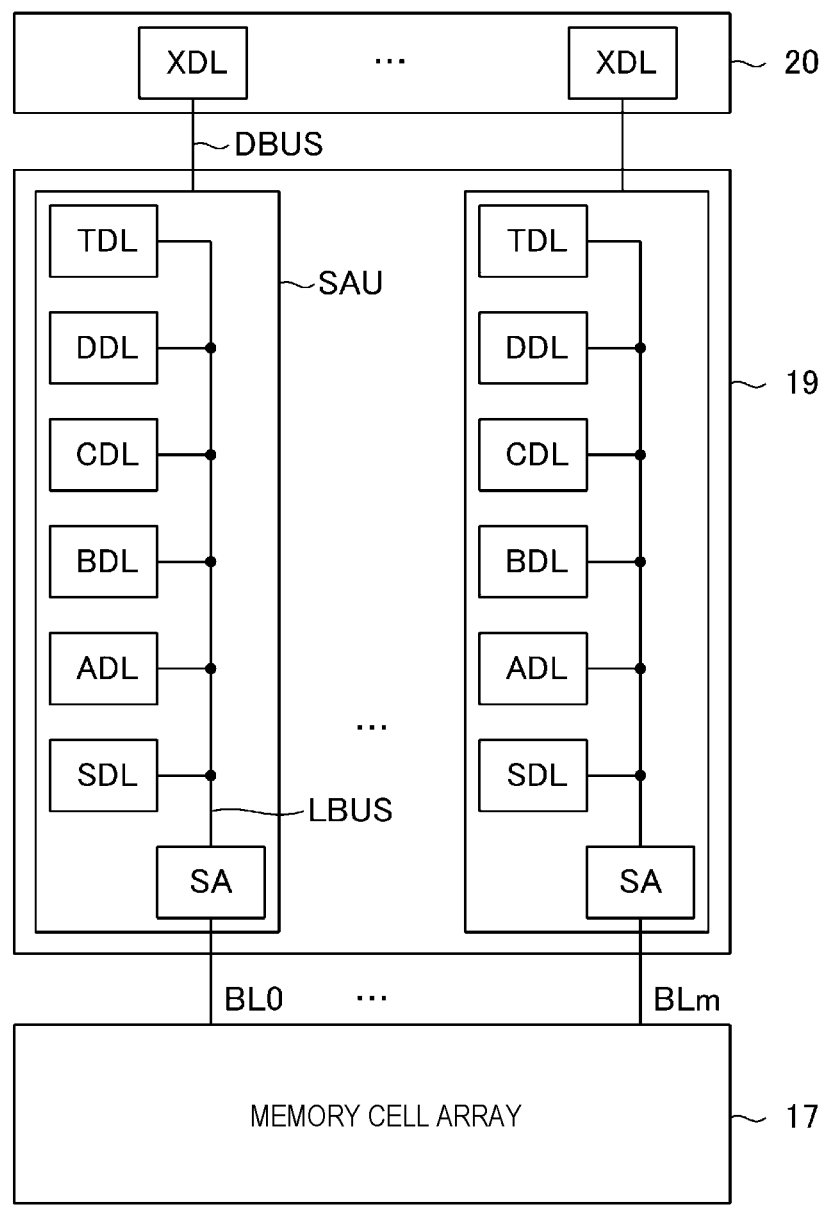
FIG. 3 is a block diagram of a data register and a sense amplifier provided in the semiconductor memory device according to the first embodiment.

Next, an example of a configuration of the data register 20 and the sense amplifier 19 will be described with reference to FIG. 3. FIG. 3 is a block diagram of the data register 20 and the sense amplifier 19.

As illustrated in FIG. 3, the sense amplifier 19 includes a plurality of sense amplifier units SAU provided for each bit line BL.

The data register 20 includes, for example, a plurality of latch circuits XDL. The latch circuits XDL correspond to the sense amplifier units SAU, respectively. The latch circuit XDL temporarily stores read data and write data. The latch circuit XDL is used for the input/output of data between the sense amplifier unit SAU and the input/output circuit 10. Each latch circuit XDL is connected to the corresponding sense amplifier unit SAU via a bus DBUS. A plurality of sense amplifier units SAU may be connected to one latch circuit XDL.

Next, an internal configuration of the sense amplifier unit SAU will be described. The sense amplifier unit SAU includes, for example, a sense amplifier circuit SA (also referred to herein as sense circuit SA) and latch circuits SDL, ADL, BDL, CDR, DDL, and TDL. The sense circuit SA and the latch circuits SDL, ADL, BDL, CDL, DDL, and TDL are connected in common to a bus LBUS. In other words, the latch circuit XDL, the sense circuit SA, and the latch circuits SDL, ADL, BDL, CDL, DDL, and TDL are connected so as to be able to transmit and receive data to and from each other.

During a read operation, the sense circuit SA senses data read out to the corresponding bit line BL, and determines whether the read data is "0" data or "1" data. Further, during a write operation, the sense circuit SA applies a voltage to the bit line BL based on data stored in the latch circuit SDL.

The latch circuits SDL, ADL, BDL, CDL, DDL, and TDL temporarily store read data and write data. For example, during a read operation, data may be transferred from the sense circuit SA to any one of the latch circuits SDL, ADL, BDL, CDR, DDL, and TDL. Further, during a write operation, data may be transferred from the latch circuit XDL to any one of the latch circuits SDL, ADL, BDL, CDR, DDL, and TDL.

A configuration of the sense amplifier unit SAU is not limited thereto, and various modifications may be made. For example, the number of latch circuits provided in the sense amplifier unit SAU may be changed based on the number of bits of data stored in one memory cell transistor MC.

1.1.4 Circuit Configuration of Sense Amplifier Unit

Figure 4:
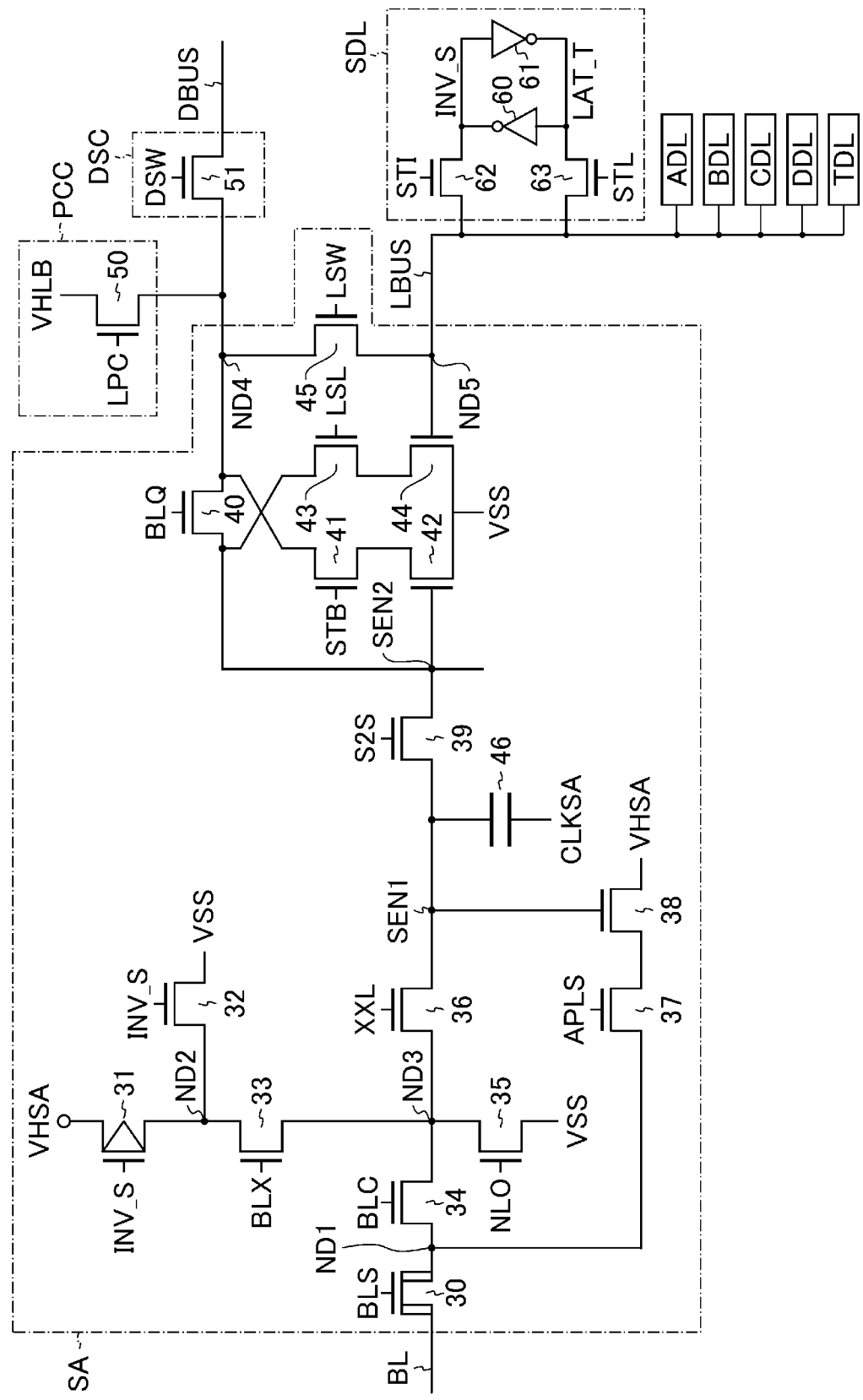
FIG. 4 is a circuit diagram of a sense amplifier unit provided in the semiconductor memory device according to the first embodiment.

Next, an example of a circuit configuration of the sense amplifier unit SAU will be described with reference to FIG. 4. FIG. 4 is a circuit diagram of the sense amplifier unit SAU. In the example illustrated in FIG. 4, a circuit diagram of the latch circuits ADL, BDL, CDR, DDL, and TDL is omitted for the sake of brevity. A circuit configuration of the latch circuits ADL, BDL, CDR, DDL, and TDL is the same as that of the latch circuit SDL. In the following description, one of the source or drain of the transistor will be referred to as "one end of the transistor", and the other of the source or drain will be referred to as "the other end of the transistor".

As illustrated in FIG. 4, the sense amplifier unit SAU includes the sense circuit SA, the latch circuits SDL, ADL, BDL, CDL, DDL, and TDL, a precharge circuit PPC, and a DBUS switch circuit DSC.

First, an internal configuration of the sense circuit SA will be described. The sense circuit SA includes a high breakdown voltage n-channel MOS transistor 30, a low breakdown voltage p-channel MOS transistor 31, low breakdown voltage n-channel MOS transistors 32 to 45, and a capacitive element 46.

One end of the transistor 30 is connected to the bit line BL. The other end of the transistor 30 is connected to a node ND1. The gate of the transistor 30 is connected to a node BLS. When the bit line BL and the sense amplifier unit SAU are electrically connected, a high ("H") level voltage which turns on the transistor 30 is applied to the node BLS.

A voltage VHSA is applied to one end of the transistor 31. The voltage VHSA is a power supply voltage of the sense circuit SA. The other end of the transistor 31 is connected to a node ND2. The gate of the transistor 31 is connected to a node INV_S. The node INV_S is a node capable of storing data in the latch circuit SDL. When the node INV_S is at a low ("L") level, the transistor 31 is turned on.

One end of the transistor 32 is connected to the node ND2. A ground voltage VSS is applied to the other end of the transistor 32. The gate of the transistor 32 is connected to the node INV_S. When the node INV_S is at the "H" level, the transistor 32 is turned on. Thus, one of the transistors 31 and 32 is turned on and the other is turned off based on a logical level of the node INV_S. In other words, either the voltage VHSA or the voltage VSS is applied to the node ND2 based on the logical level of the node INV_S.

One end of the transistor 33 is connected to the node ND2. The other end of the transistor 33 is connected to a node ND3. The gate of the transistor 33 is connected to a node BLX.

One end of the transistor 34 is connected to the node ND1. The other end of the transistor 34 is connected to the node ND3. The gate of the transistor 34 is connected to a node BLC. The transistor 34 may function as a clamp transistor that clamps a voltage applied to the bit line BL based on a voltage applied to the node BLC.

One end of the transistor 35 is connected to the node ND3. The ground voltage VSS is applied to the other end of the transistor 35. The gate of the transistor 35 is connected to a node NLO.

One end of the transistor 36 is connected to the node ND3. The other end of the transistor 36 is connected to a node SEN1. The gate of the transistor 36 is connected to a node XXL.

One end of the transistor 37 is connected to the node ND1. The gate of the transistor 37 is connected to a node APLS. The transistor 37 may function as a clamp transistor that clamps a voltage applied to the node ND1 based on a voltage applied to the node ALPS.

One end of the transistor 38 is connected to the other end of the transistor 37. The voltage VHSA is applied to the other end of the transistor 38. The gate of the transistor 38 is connected to the node SEN1. When a "H" level voltage is applied to the node SEN1, the transistor 38 is turned on. A voltage different from the voltage VHSA may be applied to the other end of the transistor 38. For example, a voltage used for the control of a signal CLKSA to be described later may be applied.

One end of the transistor 39 is connected to the node SEN1. The other end of the transistor 39 is connected to a node SEN2. The gate of the transistor 39 is connected to a node S2S. For example, the sense circuit SA may execute a calculation using transistors 40 to 45 to be described later. For example, when executing a calculation, the sense circuit SA may turn off the transistor 39, thereby executing the calculation while maintaining the voltage of the node SEN1.

One end of the transistor 40 is connected to the node SEN2. The other end of the transistor 40 is connected to a node ND4. The gate of the transistor 40 is connected to a node BLQ. For example, the transistor 40 is turned on when a "H" level voltage is applied from the precharge circuit PPC to the nodes SEN1 and SEN2.

One end of the transistor 41 is connected to the node ND4. The other end of the transistor 41 is connected to one end of the transistor 42. A signal STB is input to the gate of the transistor 41. When the signal STB is asserted, the sense circuit SA determines data stored in the selected memory cell transistor MC. More specifically, the transistor 41 is turned on when the "H" level signal STB is input. When the transistor 42 is in the ON state during this time, the bus LBUS is discharged via the transistors 41, 42, and 45. Meanwhile, when the transistor 42 is in an OFF state, the bus LBUS is not discharged via the transistors 41, 42, and 45. Data ("0" or "1") based on the voltage of the bus LBUS is stored in any one of the latch circuits SDL, ADL, BDL, CDR, DDL, and TDL sharing the bus LBUS.

The voltage VSS is applied to the other end of the transistor 42. The gate of the transistor 42 is connected to the node SEN2. The transistor 42 functions as a sense transistor that senses the voltage of the node SEN2. For example, when the voltage of the node SEN2 is equal to or higher than the threshold voltage of the transistor 42, the transistor 42 is turned on. Meanwhile, when the voltage of the node SEN2 is less than the threshold voltage of the transistor 42, the transistor 42 is turned off.

One end of the transistor 43 is connected to the node SEN2. The other end of the transistor 43 is connected to one end of the transistor 44. The gate of the transistor 43 is connected to a node LSL.

The voltage VSS is applied to the other end of the transistor 44. The gate of the transistor 44 is connected to the bus LBUS via a node ND5.

One end of the transistor 45 is connected to the node ND4. The other end of the transistor 45 is connected to the bus LBUS via the node ND5. The gate of the transistor 45 is connected to a node LSW. For example, the transistor 45 is turned on while the signal STB is asserted.

One electrode of the capacitive element 46 is connected to the node SEN1. The clock signal CLKSA is input to the other electrode of the capacitive element 46.

Next, the precharge circuit PPC will be described. The precharge circuit PPC is a precharge circuit of the bus LBUS and the node SEN1. The precharge circuit PPC includes a low breakdown voltage n-channel MOS transistor 50. A voltage VHLB is applied to one end of the transistor 50. The voltage VHLB is a precharge voltage. The other end of the transistor 50 is connected to the node ND4. The gate of the transistor 50 is connected to a node LPC. For example, when the transistors 45 and 50 are in the ON state, the precharge circuit PCC charges the bus LBUS with a "H" level voltage. Further, when the transistors 39, 40, and 50 are in the ON state, the precharge circuit PCC charges the node SEN1 with a "H" level voltage.

Next, the DBUS switch circuit DSC will be described. The DBUS switch circuit DSC is a circuit that interconnects the sense amplifier unit SAU and the bus DBUS. In other words, the DBUS switch circuit DSC interconnects the sense amplifier unit SAU and the latch circuit XDL. The DBUS switch circuit DSC includes a low breakdown voltage n-channel MOS transistor 51. One end of the transistor 51 is connected to the node ND4. The other end of the transistor 51 is connected to the bus DBUS. The gate of the transistor 51 is connected to a node DSW.

Next, an internal configuration of the latch circuit SDL will be described. The latch circuit SDL includes inverters 60 and 61 and low breakdown voltage n-channel MOS transistors 62 and 63.

An input node of the inverter 60 is connected to a node LAT_T. An output node of the inverter 60 is connected to the node INV_S.

An input node of the inverter 61 is connected to the node INV_S. An output node of the inverter 61 is connected to the node LAT_T.

One end of the transistor 62 is connected to the bus LBUS. The other end of the transistor 62 is connected to the node INV_S. The gate of the transistor 62 is connected to a node STI.

One end of the transistor 63 is connected to the bus LBUS. The other end of the transistor 63 is connected to the node LAT_T. The gate of the transistor 63 is connected to a node STL.

The latch circuit SDL stores data in the node LAT_T. Meanwhile, the latch circuit SDL stores, in the node INV_S, the inverted data of the data stored in the node LAT_T.

Each of the nodes BLS, BLX, BLC, NLO, XXL, APLS, S2S, BLQ, LSL, LSW, LPC, DSW, STI, and STL is shared among, for example, the plurality of sense amplifier units SAU. A signal based on the control of the sequencer 14 is input (voltage is applied) to each of the nodes BLS, BLX, BLC, NLO, XXL, APLS, S2S, BLQ, LSL, LSW, LPC, DSW, STI, and STL.

1.1.5 Circuit Configuration of Voltage Generation Circuit

Figure 5:
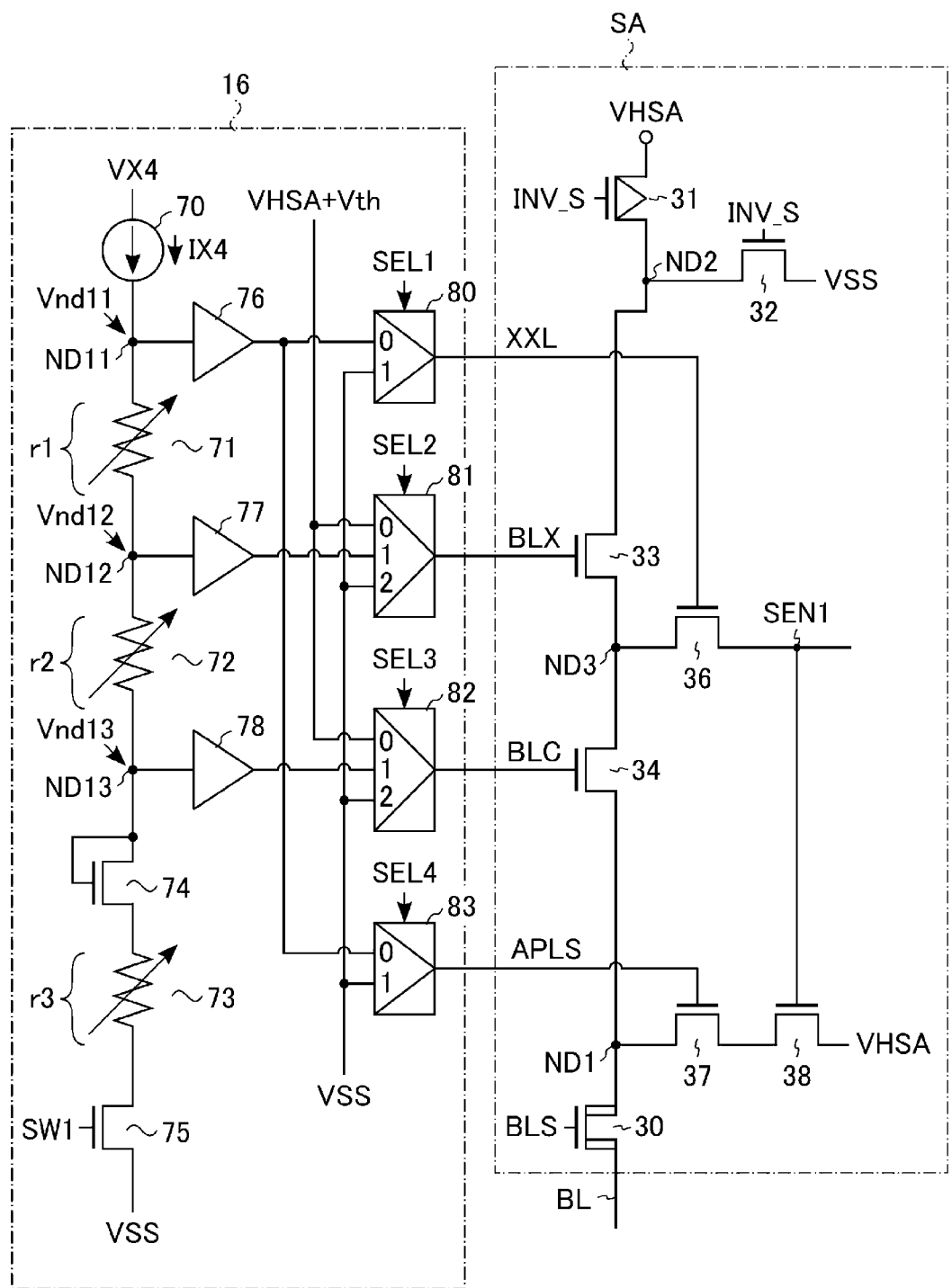
FIG. 5 is a circuit diagram of a voltage generation circuit and a sense circuit provided in the semiconductor memory device according to the first embodiment.

Next, an example of a circuit configuration of the voltage generation circuit 16 will be described with reference to FIG. 5. FIG. 5 is a circuit diagram of the voltage generation circuit 16 and the sense circuit SA. FIG. 5 illustrates a part of the voltage generation circuit 16 and a part of the sense circuit SA corresponding to the nodes XXL, BLX, BLC, and APLS. The sense circuit SA illustrated in FIG. 5 is an excerpt of a part of the sense circuit SA illustrated in FIG. 4 and described above. Therefore, in the following description, the description of the sense circuit SA will be omitted.

As illustrated in FIG. 5, the voltage generation circuit 16 includes a current source 70, variable resistance elements 71 to 73, n-channel MOS transistors 74 and 75, drivers 76 to 78, and selector circuits 80 to 83.

A voltage VX4 is applied to an input terminal of the current source 70. The current source 70 supplies a constant current IX4 from an output terminal thereof. The output terminal of the current source 70 is connected to a node ND11.

One end of the variable resistance element 71 is connected to the node ND11. The other end of the variable resistance element 71 is connected to a node ND12. For example, the resistance value of the variable resistance element 71 is r1.

One end of the variable resistance element 72 is connected to the node ND12. The other end of the variable resistance element 72 is connected to a node ND13. For example, the resistance value of the variable resistance element 72 is r2.

One end and the gate of the transistor 74 are connected to the node ND13. One end of the variable resistance element 73 is connected to the other end of the transistor 74. The transistor 74 functions as a diode.

The other end of the variable resistance element 73 is connected to one end of the transistor 75. For example, the resistance value of the variable resistance element 73 is r3.

The voltage VSS is applied to the other end of the transistor 75. A signal SW1 is input to the gate of the transistor 75. For example, the signal SW1 is a signal that controls the presence/absence of voltage application to the nodes XXL, BLX, BLC, and APLS.

The driver 76 is a voltage drive circuit in the node ND11. For example, the driver 76 includes a unity gain operational amplifier. The voltage of the node ND11 is applied to an input terminal of the driver 76. For example, a voltage Vnd11 in the node ND11 is $Vnd11=IX4*(r1+r2+r3)+Vth74$ when the ON-resistance of the transistors 74 and 75 is ignored. The voltage Vth74 is the threshold voltage of the diode-connected transistor 74.

The driver 77 is a voltage drive circuit in the node ND12. For example, the driver 77 includes a unity gain operational amplifier. The voltage of the node ND12 is applied to an input terminal of the driver 77. For example, a voltage Vnd12 in the node ND12 is $Vnd12=IX4*(r2+r3)+Vth74$ when the ON-resistance of the transistors 74 and 75 is ignored. Thus, the voltage Vnd12 applied to the input terminal of the driver 77 is lower than the voltage Vnd11 applied to the input terminal of the driver 76. In other words, the output voltage of the driver 77 is lower than the output voltage of the driver 76. There is a relationship of $Vnd11-Vnd12=IX4*r1$. Accordingly, by controlling the resistance value r1 of the variable resistance element 71, the voltage difference between the voltage Vnd11 and the voltage Vnd12 may be controlled.

The driver 78 is a voltage drive circuit in the node ND13. For example, the driver 78 includes a unity gain operational amplifier. The voltage of the node ND13 is applied to an input terminal of the driver 78. For example, a voltage Vnd13 in the node ND13 is Vnd13=IX4*r3+Vth74 when the ON-resistance of the transistors 74 and 75 is ignored. Thus, the voltage Vnd13 applied to the input terminal of the driver 78 is lower than the voltage Vnd12 applied to the input terminal of the driver 77. In other words, the output voltage of the driver 78 is lower than the output voltage of the driver 77. There is a relationship of Vnd12-Vnd13=IX4*r2. Accordingly, by controlling the resistance value r2 of the variable resistance element 72, the voltage difference between the voltage Vnd12 and the voltage Vnd13 may be controlled. The voltages Vnd11, Vnd12, and Vnd13 have a relationship of Vnd11>Vnd12>Vnd13.

The selector circuit 80 has a $0^{th}$ input terminal and a first input terminal. The selector circuit 80 electrically connects one of the $0^{th}$ input terminal and the first input terminal to an output terminal based on a signal SEL1. The $0^{th}$ input terminal of the selector circuit 80 is connected to an output terminal of the driver 76. The voltage VSS is applied to the first input terminal of the selector circuit 80. The output terminal of the selector circuit 80 is connected to the node XXL.

The selector circuit 81 has a $0^{th}$ input terminal, a first input terminal, and a second input terminal. The selector circuit 81 electrically connects one of the $0^{th}$ input terminal, the first input terminal, and the second input terminal to an output terminal based on a signal SEL2. A voltage VHSA+Vth is applied to the $0^{th}$ input terminal of the selector circuit 81. A voltage Vth is the threshold voltage of the low breakdown voltage n-channel MOS transistors 32 to 45 of the sense circuit SA. The first input terminal of the selector circuit 81 is connected to an output terminal of the driver 77. The voltage VSS is applied to the second input terminal of the selector circuit 81. The output terminal of the selector circuit 81 is connected to the node BLX.

The selector circuit 82 has a $0^{th}$ input terminal, a first input terminal, and a second input terminal. The selector circuit 82 electrically connects one of the $0^{th}$ input terminal, the first input terminal, and the second input terminal to an output terminal based on a signal SEL3. The voltage VHSA+Vth is applied to the $0^{th}$ input terminal of the selector circuit 82. The first input terminal of the selector circuit 82 is connected to an output terminal of the driver 78. The voltage VSS is applied to the second input terminal of the selector circuit 82. The output terminal of the selector circuit 82 is connected to the node BLC.

The selector circuit 83 has a $0^{th}$ input terminal and a first input terminal. The selector circuit 83 electrically connects one of the $0^{th}$ input terminal and the first input terminal to an output terminal based on a signal SEL4. The $0^{th}$ input terminal of the selector circuit 83 is connected to the output terminal of the driver 76. The voltage VSS is applied to the first input terminal of the selector circuit 83. The output terminal of the selector circuit 83 is connected to the node APLS.

The signals SEL1 to SEL4 are signals based on the control of the sequencer 14.

1.2 Data Storage Method

Figure 6:
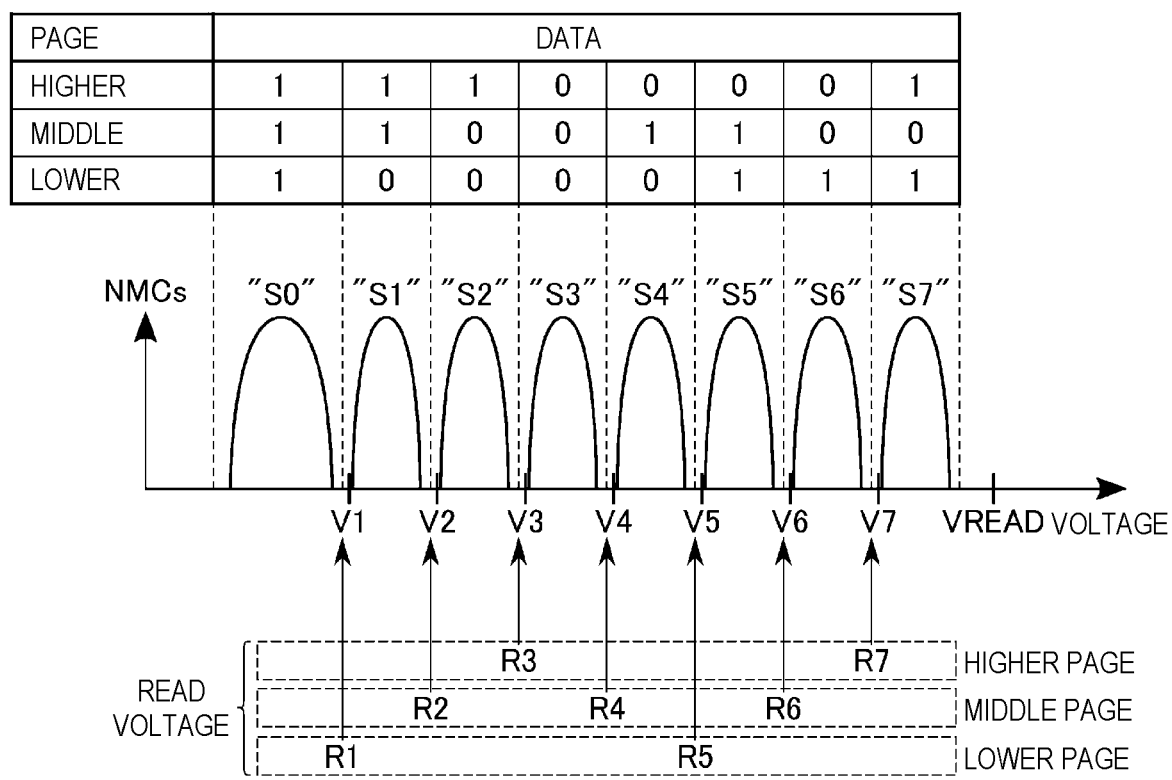
FIG. 6 is a conceptual diagram illustrating an example of a data storage method in the semiconductor memory device according to the first embodiment.

Next, an example of a data storage method will be described with reference to FIG. 6. FIG. 6 is a conceptual diagram illustrating an example of a data storage method. FIG. 6 illustrates an example of the threshold voltage distribution of the memory cell transistors MC, the assignment of data, and the voltage used for reading out the data. In the threshold voltage distribution diagram referred to below, "NMCs" on the vertical axis indicates the number of memory cell transistors MC, and the voltage on the horizontal axis indicates the voltage applied to the gate of the memory cell transistor MC.

As illustrated in FIG. 6, when the memory cell transistors MC are each a TLC that stores 3-bit data, the threshold voltage distribution formed by the plurality of memory cell transistors MC provided in the cell unit CU may be one of eight states. Hereinafter, these eight states will be referred to as "S0" state, "S1" state, "S2" state, "S3" state, "S4" state, "S5" state, "S6" state, and "S7" state, respectively, in order from the lowest threshold voltage.

When the memory cell transistor MC is in the erased state, the threshold voltage of the memory cell transistor MC is included in the "S0" state. When data is written to the memory cell transistor MC, the threshold voltage of the memory cell transistor MC is included in one of the "S0" to "S7" states. Different 3-bit data are assigned to each of the "S0" to "S7" states. The assignment of data in each of two neighboring states may be set in such a way that only 1-bit data is different. Hereinafter, an example of the assignment of data for the eight states will be described.

the "S0" state: "111 (higher bit/middle bit/lower bit)" data;
the "S1" state: "110" data;
the "S2" state: "100" data;
the "S3" state: "000" data;
the "S4" state: "010" data;
the "S5" state: "011" data;
the "S6" state: "001" data; and
the "S7" state: "101" data.

A verify voltage used for checking the writing of data or a read voltage used for reading out data is set between the respective neighboring states. Specifically, a verify voltage V1 and a read voltage R1 are set between the "S0" state and the "S1" state. A verify voltage V2 and a read voltage R2 are set between the "S1" state and the "S2" state. A verify voltage V3 and a read voltage R3 are set between the "S2" state and the "S3" state. A verify voltage V4 and a read voltage R4 are set between the "S3" state and the "S4" state. A verify voltage V5 and a read voltage R5 are set between the "S4" state and the "S5" state. A verify voltage V6 and a read voltage R6 are set between the "S5" state and the "S6" state. A verify voltage V7 and a read voltage R7 are set between the "S6" state and the "S7" state. The verify voltages V1 to V7 may be set higher than the read voltages R1 to R7, respectively.

The verify voltages V1 to V7 are associated with the "S1" to "S7" states, respectively. In a write operation, the semiconductor memory device 1 checks whether or not the threshold voltage of the memory cell transistor MC to which certain data is to be stored exceeds a verify voltage associated with that data by a read operation (hereinafter referred to as "verify operation") using the verify voltage. Then, the sequencer 14 completes the writing of data to that memory cell transistor MC when detecting that the threshold voltage of that memory cell transistor MC exceeds the verify voltage associated with that data.

The read voltage R1 is used to distinguish the "S0" state from the "S1" state or higher. The read voltage R2 is used to distinguish the "S1" state or lower from the "S2" state or higher. The read voltage R3 is used to distinguish the "S2" state or lower from the "S3" state or higher. The read voltage R4 is used to distinguish the "S3" state or lower from the "S4" state or higher. The read voltage R5 is used to distinguish the "S4" state or lower from the "S5" state or higher. The read voltage R6 is used to distinguish the "S5" state or lower from the "S6" state or higher. The read voltage R7 is used to distinguish the "S6" state or lower from the "S7" state or higher. Further, a read pass voltage VREAD is set to a voltage higher than the highest state. The memory cell transistor MC having the gate to which the read pass voltage VREAD is applied is turned on regardless of data stored therein.

In a read operation, the semiconductor memory device 1 uses at least one read voltage to determine the threshold voltage state of the memory cell transistor MC. For example, lower page data, which is a set of lower bit data, is determined by a read operation using each of the read voltages R1 and R5. Middle page data, which is a set of middle bit data, is determined by a read operation using each of the read voltages R2, R4 and R6. Higher page data, which is a set of higher bit data, is determined by a read operation using each of the read voltages R3 and R7. A calculation processing is appropriately executed in a page read operation in which a plurality of read voltages are used.

The semiconductor memory device 1 may use any other data assignment when the memory cell transistor MC is a TLC (hereinafter referred to as "TLC method"). Furthermore, the semiconductor memory device 1 may use a storage method other than the TLC method. For example, one memory cell transistor MC may store 2-bit data, or data of 4 bits or more. The operations described herein may be executed regardless of the data storage method or the type of the assignment of data.

Further, an immediately preceding state herein indicates one of neighboring states having a lower threshold voltage. For example, the immediately preceding state for the "S2" state is the "S1" state.

1.3. Write Operation

Next, a write operation will be described. In the following description, the word line WL selected in a write operation will be referred to as "word line WLsel". The memory cell transistor MC connected to the word line WLsel will be referred to as "memory cell transistor MCsel".

1.3. Outline of Write Operation

First, the outline of a write operation will be described with reference to FIG. 7. FIG. 7 is a timing chart illustrating the outline of a write operation. As illustrated in FIG. 7, the semiconductor memory device 1 repeatedly executes a program loop in the write operation. FIG. 7 illustrates the number of times the program loop is executed in the write operation (hereinafter referred to as "the number of loops") and a change in the voltage of the word line WLsel (WLsel voltage). Each program loop includes a program operation (Program) and a verify operation (Verify).

The program operation may raise the threshold voltage of the memory cell transistor MC. In the program operation, a plurality of memory cell transistors MCsel connected to the word line WLsel are set as a program-target or a program-inhibit based on write data stored in the associated sense amplifier unit SAU. Specifically, the memory cell transistor MCsel which has not reached the threshold voltage of a write target state (hereinafter referred to as "write state") is set as the program-target. Meanwhile, the memory cell transistor MCsel which has reached the threshold voltage of the write state is set as the program-inhibit.

In the program operation, a program voltage VPGM is applied to the word line WLsel. The program voltage VPGM is a high voltage capable of raising the threshold voltage of the memory cell transistor MCsel. The program voltage VPGM is stepped up, for example, for each repetition of the program loop. That is, the program voltage VPGM may rise in response to the number of executed program loops. The step-up width DVPGM of the program voltage VPGM may be set to any value. When the program voltage VPGM is applied to the word line WLsel, the threshold voltage of the memory cell transistor MCsel which is connected to the word line WLsel and is also connected to the bit line BL as the program-target rises. Meanwhile, the threshold voltage of the memory cell transistor MCsel which is connected to the word line WLsel and is also connected to the bit line BL as the program-prohibit is prevented from rising by self-boost techniques. The sequencer 14 executes the verify operation when ending the program operation.

The verify operation is a read operation of checking whether or not the threshold voltage of the memory cell transistor MCsel has reached the threshold voltage of the write state. The sequencer 14 executes the verify operation for the memory cell transistor MCsel which is set as the program-target and corresponds to the write state of a verify target in the same program loop.

In the verify operation, the sense amplifier unit SAU determines whether or not the threshold voltage of the memory cell transistor MCsel exceeds a verify voltage applied to the word line WLsel based on the voltage of the bit line BL. Each sense amplifier unit SAU determines, as "verify pass", the memory cell transistor MCsel which may be regarded as the threshold voltage of the memory cell transistor MCsel exceeding the verify voltage, i.e., has reached the threshold voltage of the write state. Meanwhile, each sense amplifier unit SAU determines, as "verify fail", the memory cell transistor MCsel which may be regarded as the threshold voltage of the memory cell transistor MCsel being equal to or less than the verify voltage, i.e., has not reached the threshold voltage of the write state. Each sense amplifier unit SAU stores the verify result of the write state described above in any one latch circuit therein. When the verify operation is completed, the sequencer 14 sets each memory cell transistor MCsel as the program-target or the program-inhibit based on the verify result in the current program loop, and starts a processing of the next program loop.

The semiconductor memory device 1 may appropriately execute a detection operation ("Detection") after each program loop. In the detection operation, the number of memory cell transistors MCsel determined as the verify pass is counted for each write state. Then, the sequencer 14 determines whether or not the writing of that write state has completed based on the count value for each write state. The sequencer 14 ends the write operation, for example, when detecting that the number of memory cell transistors MCsel which are not determined as the verify pass of the "S1" to "S7" states is below a predetermined number after each repetition of the program loop.

1.3.2 Specific Example of Program Loop

Next, a specific example of the program loop will be described with reference to FIG. 8. FIG. 8 is a table illustrating an example of setting a program loop in a write operation. The table illustrated in FIG. 8 illustrates a relationship between the number of loops and the write state of a verify target allocated to that loop, and the white circle indicates where the verify operation is set.

As illustrated in FIG. 8, the type and number of write states of a verify target may be changed according to the progress of the program loop. In this example, the sequencer 14 executes a maximum of 19 program loops. Then, the sequencer 14 executes the verify operation targeting at least one type of state in each of the 19 program loops.

Specifically, the "S1" state is set as a verify target in the first to sixth program loops. The "S2" state is set as a verify target in the second to eighth program loops. The "S3" state is set as a verify target in the fourth to tenth program loops. The "S4" state is set as a verify target in the sixth to twelfth program loops. The "S5" state is set as a verify target in the eighth to fourteenth program loops. The "S6" state is set as a verify target in the tenth to sixteenth program loops. The "S7" state is set as a verify target in the twelfth to nineteenth program loops.

The number of program loops that the semiconductor memory device 1 may execute in one write operation may be any other number. The sequencer 14 may end the write operation according to the execution of a predetermined number of program loops even if writing has not completed in all the write states. The write state of the verify target associated with the number of loops may be set in any other manner. The sequencer 14 may omit the program operation and the verify operation of a write state in the next and subsequent program loops based on the result of the detection operation.

1.3.3 Details of Program Method

Figure 9:
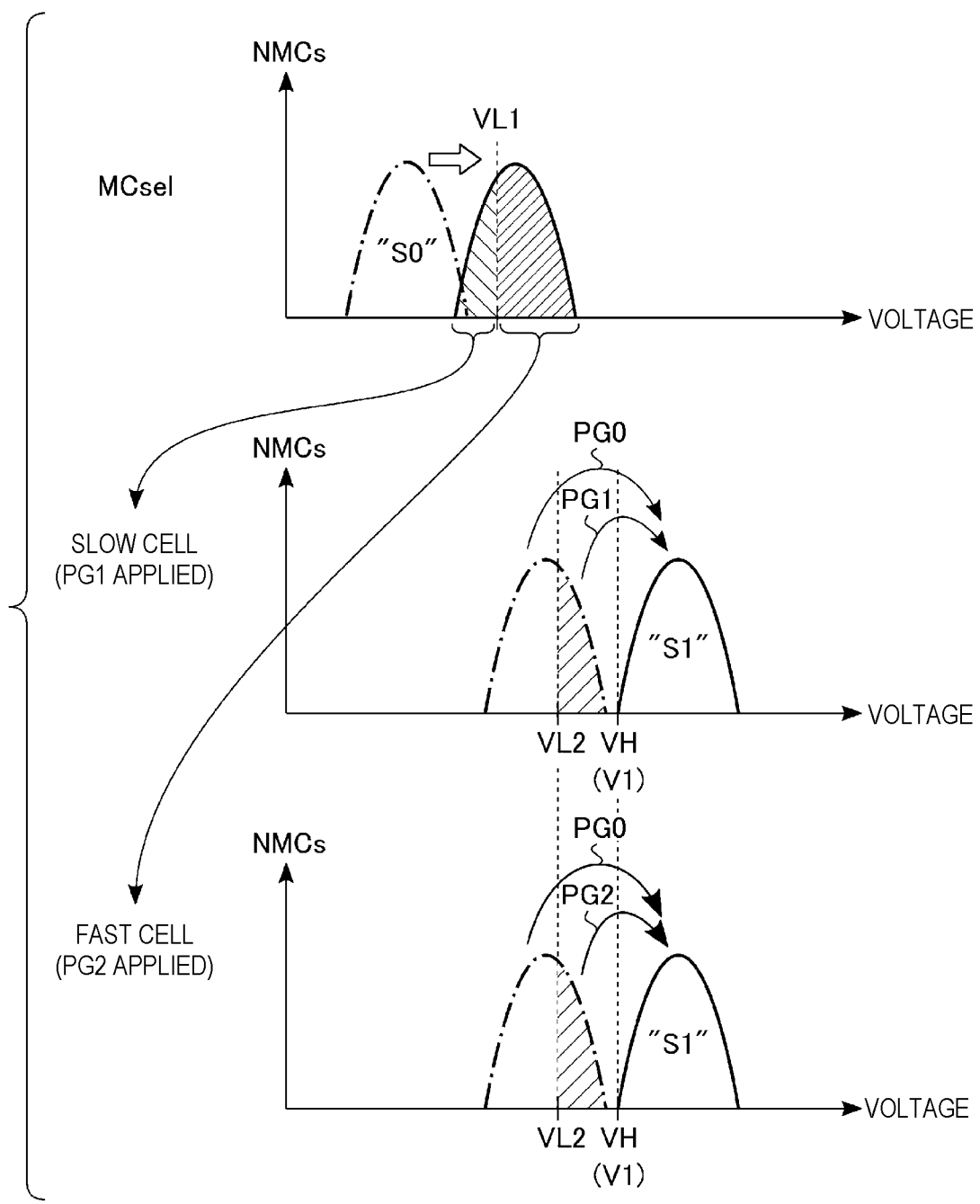
FIG. 9 is a threshold voltage distribution diagram illustrating a relationship between three types of verify voltages used for each write state and three types of program operations in a write operation in the semiconductor memory device according to the first embodiment.

Next, details of a program method will be described with reference to FIG. 9. FIG. 9 is a threshold voltage distribution diagram illustrating a relationship between three types of program conditions and three types of verify voltages which may be used for each write state in a write operation. The example illustrated in FIG. 9 illustrates a case where all the memory cell transistors MCsel are written from the "S0" state to the "S1" state.

As illustrated in FIG. 9, a first verify low voltage VL1, a second verify low voltage VL2, and a verify high voltage VH used for the verify operation are set for each write state. That is, the verify operation includes a verify operation using the first verify low voltage VL1 (hereinafter referred to as "VL1 verify operation"), a verify operation using the second verify low voltage VL2 (hereinafter referred to as "VL2 verify operation"), and a verify operation using the verify high voltage VH (hereinafter referred to as "VH verify operation"). The verify high voltage VH is the verify voltage described with reference to FIG. 6. In the example illustrated in FIG. 9, VH=V1. The first verify low voltage VL1, the second verify low voltage VL2, and the verify high voltage VH have a relationship of VL1<VL2<VH.

In the first embodiment, the first verify low voltage VL1 is a voltage for distinguishing between a memory cell transistor MCsel having a relatively large increase in the threshold voltage (hereinafter referred to as "fast cell") and a memory cell transistor MCsel having a relatively small increase in the threshold voltage (hereinafter referred to as "slow cell").

The sequencer 14 executes the VL1 verify operation once for each write state. In the VL1 verify operation, the sequencer 14 determines the memory cell transistor MCsel in which the threshold voltage is equal to or less than the voltage VL1 as the slow cell. In other words, the memory cell transistor MCsel which fails the VL1 verify operation is determined as the slow cell. Meanwhile, in the VL1 verification operation, the sequencer 14 determines the memory cell transistor MCsel in which the threshold voltage exceeds the voltage VL1 as the fast cell. In other words, the memory cell transistor MCsel which passes the VL1 verify operation is determined as the fast cell. Hereinafter, the determination for distinguishing between the fast cell and the slow cell based on the VL1 verification operation will be referred to as "cell determination".

In the first embodiment, the second verify low voltage VL2 is a voltage for determining the magnitude of the difference between the threshold voltage of the memory cell transistor MCsel and the voltage VH for each of the fast cell and the slow cell.

The sequencer 14 executes the VL2 verify operation and the VH verify operation in each program loop. The sequencer 14 determines the conditions for the program operation of the next program loop based on the results of the VL2 verify operation and the VH verify operation.

More specifically, the program operation includes three program conditions PG0 to PG2 and a program inhibition condition INH. For example, when the threshold voltage of the memory cell transistor MCsel is equal to or less than the voltage VL2, the sequencer 14 applies the program condition PG0 in the program operation of the next program loop. In other words, the program operation to which the program condition PG0 is applied (hereinafter referred to as "PG0 program operation") is executed for the memory cell transistor MCsel failing the VL2 verify operation.

Further, when the threshold voltage of the memory cell transistor MCsel exceeds the voltage VL2 and is equal to or less than the voltage VH, the sequencer 14 applies the program condition PG1 to the slow cell and applies the program condition PG2 to the fast cell in the program operation of the next program loop. In other words, the program operation to which the program condition PG1 is applied (hereinafter referred to as "PG1 program operation") is executed for the slow cell which passes the VL2 verify operation and fails the VH verify operation. Meanwhile, the program operation to which the program condition PG2 is applied (hereinafter referred to as "PG2 program operation") is executed for the fast cell which passes the VL2 verify operation and fails the VH verify operation.

Further, when the threshold voltage of the memory cell transistor MCsel exceeds the voltage VH, the sequencer 14 sets that memory cell transistor MC to the program-inhibit in the program operation of the next program loop.

The program condition PG0 is a program condition in which the variation of the threshold voltage of the memory cell transistor MC is relatively large. The program condition PG1 is a program condition in which the variation of the threshold voltage of the memory cell transistor MC is smaller than the program condition PG0. The program condition PG1 is applied to the slow cell. The program condition PG2 is a program condition in which the variation of the threshold voltage of the memory cell transistor MC is smaller than the program condition PG0. The program condition PG2 is applied to the fast cell. For example, in the program operation of one memory cell transistor MC, when any one of the program condition PG0, the program condition PG1, the program condition PG2, and the program inhibition condition INH is applied, the variation of the threshold voltage of the memory cell transistor MC has a relationship of "program condition PG0">"program condition PG1">"program condition PG2">"program inhibition condition INH". For example, when the PG0 program operation is executed in a state where the threshold voltage of the memory cell transistor MC exceeds the voltage VL2 and is equal to or less than the voltage VH, there is a possibility that the threshold voltage of the memory cell transistor MC will exceed the voltage VH by a relatively large amount. Accordingly, the PG1 program operation is executed in the slow cell, and the PG2 program operation is executed in the fast cell. The variation in the threshold voltage of the slow cell due to the PG1 program operation and the variation in the threshold voltage of the fast cell due to the PG2 program operation are each smaller than the variation that would be caused by the PG0 program operation.

The sequencer 14 may apply the program condition PG1 or the program condition PG2 in the final program operation among a plurality of program operations executed for one write state. In this case, the memory cell transistor MCsel on which the PG1 program operation or the PG2 program operation is executed is set to the program-inhibit in the next and subsequent program loops. The sequencer 14 reduces excess increase of the threshold voltages of the plurality of memory cell transistors MCsel by applying the program condition PG1 to the slow cell and applying the program condition PG2 to the fast cell.

Figure 10:
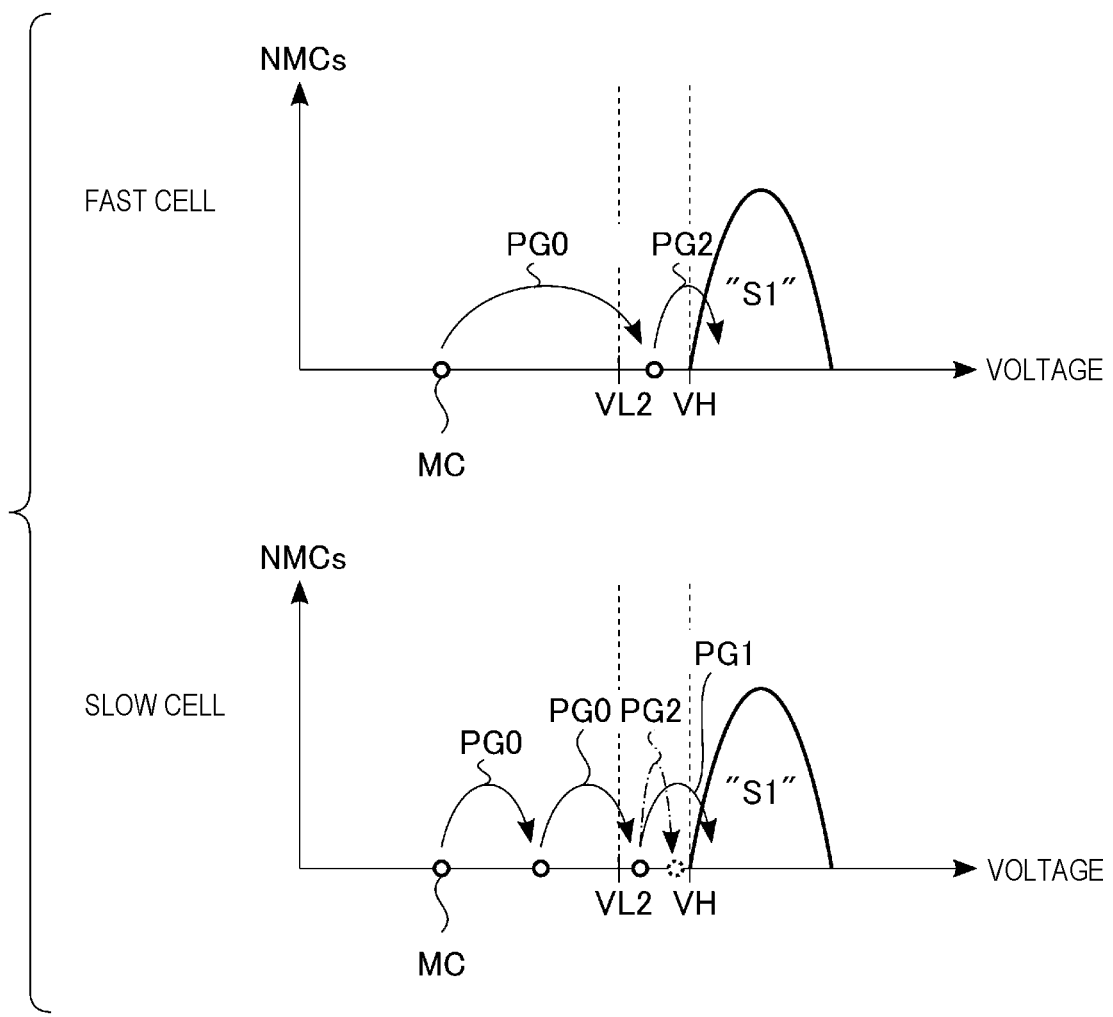
FIG. 10 is a conceptual diagram illustrating a change in the threshold voltage of a fast cell and a slow cell in a write operation in the semiconductor memory device according to the first embodiment.

Next, an example of a relationship between the threshold voltage of the memory cell transistor MC and the program condition will be described with reference to FIG. 10. FIG. 10 is a conceptual diagram illustrating a change in the threshold voltage of the fast cell and the slow cell in a write operation.

As illustrated in FIG. 10, when the same program condition is applied and executed for the fast cell and the slow cell, for example, in the program operation, the fast cell has a larger variation of the threshold voltage in one program operation. In the example illustrated in FIG. 10, when the PG0 program operation is executed once in the fast cell, the threshold voltage of the fast cell exceeds the voltage VL2 and then rises to the voltage VH or less. Then, when the PG2 program operation is subsequently executed in the fast cell, the threshold voltage of the fast cell exceeds the voltage VH. At this time, an increase in the threshold voltage of the fast cell is reduced as compared with a case of the first PG0 program operation. Meanwhile, when the PG0 program operation is executed twice in the slow cell, the threshold voltage of the slow cell exceeds the voltage VL2 and then rises to the voltage VH or less. In this state, for example, when the program condition PG2 is applied to the next program operation of the slow cell, the variation of the threshold voltage of the slow cell is smaller than the variation of the threshold voltage of the fast cell on which the PG2 program operation is executed. Thus, there is a possibility that the threshold voltage of the slow cell does not reach the voltage VH. Therefore, the program condition PG1 causing a larger variation in the threshold voltage than the program condition PG2 is applied to the program operation of the slow cell.

1.3.4 Voltage of Word and Bit Lines in Program Operation

Next, an example of the voltages of the word line WL and the bit line BL in the program operation will be described with reference to FIG. 11. FIG. 11 is a timing chart illustrating the voltage of the word line WLsel and the voltage of the bit line BL in the program operation. Hereinafter, the bit line BL connected to the memory cell transistor MCsel which is a target of the PG0 program operation will be referred to as "bit line BL_pg0". The bit line BL connected to the memory cell transistor MCsel which is a target of the PG1 program operation will be referred to as "bit line BL_pg1". The bit line BL connected to the memory cell transistor MCsel which is a target of the PG2 program operation will be referred to as "bit line BL_pg2". The bit line BL connected to the memory cell transistor MCsel which is the program-inhibit will be referred to as "bit line BL_inh".

As illustrated in FIG. 11, at the start of the program operation, the voltage of the word line WLsel and the bit lines BL_pg0, BL_pg1, BL_pg2, and BL_inh is, for example, the voltage VSS. While the program voltage VPGM is applied to the word line WLsel, the voltage VSS is applied to the bit line BL_pg0. A voltage VQPW1 is applied to the bit line BL_pg1. A voltage VQPW2 is applied to the bit line BL_pg2. A voltage VINH is applied to the bit line BL_inh. The voltage VQPW1 is a voltage higher than the voltage VSS. The voltage VQPW2 is a voltage higher than the voltage VQPW1. A voltage VSGD is a voltage applied to the select gate line SGD corresponding to the target string unit SU while the program voltage VPGM is applied to the word line WLsel. The voltage VINH is a voltage higher than the voltage VQPW2 and the voltage VSGD. In other words, the sense amplifier 19 applies the voltage VSS to the bit line BL_pg0, applies the voltage VQPW1 to the bit line BL_pg1, applies the voltage VQPW2 to the bit line BL_pg2, and applies the voltage VINH to the bit line BL_inh while the program voltage VPGM is applied to the word line WLsel.

While the program voltage VPGM is applied to the word line WLsel, the select transistor ST1 is turned on in the NAND string NS connected to the bit line BL_pg0, BL_pg1 or BL_pg2. At this time, the voltage VSS is applied to a channel of the memory cell transistor MCsel corresponding to the bit line BL_pg0. The voltage VQPW1 is applied to a channel of the memory cell transistor MCsel corresponding to the bit line BL_pg1. The voltage VQPW2 is applied to a channel of the memory cell transistor MCsel corresponding to the bit line BL_pg2. Meanwhile, in the NAND string NS connected to the bit line BL_inh, the select transistor ST1 is in the cutoff state. That is, a channel of the memory cell transistor MCsel corresponding to the bit line BL_inh is in an electrically floating state.

As a result, in the memory cell transistor MCsel corresponding to the bit line BL_pg0, electrons are injected into the charge storage layer based on the voltage difference between the voltage VPGM and the voltage VSS, resulting in an increase in the threshold voltage. In the memory cell transistor MCsel corresponding to the bit line BL_pg1, electrons are injected into the charge storage layer based on the voltage difference between the voltage VPGM and the voltage VQPW1, resulting in an increase in the threshold voltage. In the memory cell transistor MCsel corresponding to the bit line BL_pg2, electrons are injected into the charge storage layer based on the voltage difference between the voltage VPGM and the voltage VQPW2, resulting in an increase in the threshold voltage. The voltage difference between the program voltage VPGM and the channel voltage has a relationship of (VPGM-VSS)>(VPGM-VQPW1) >(VPGM-VQPW2). Therefore, the ease of increasing the threshold voltage has a relationship of "program condition PG0">"program condition PG1">"program condition PG2". Further, in the memory cell transistor MCsel corresponding to the bit line BL_inh, the voltage of the channel in the electrically floating state rises as the voltage VPGM applied to the word line WLsel rises. Therefore, an increase in the threshold voltage is prevented.

1.3.5 Setting of Verify Voltage

Next, an example of setting the verify voltage will be described with reference to FIG. 12. FIG. 12 is a table illustrating an example of setting the verify voltage.

As illustrated in FIG. 12, the verify voltage described with reference to FIG. 6 is used as the verify high voltage VH of each write state. Specifically, the verify high voltage VH of the "S1" state is a voltage V1. The verify high voltage VH of the "S2" state is a voltage V2. The verify high voltage VH of the "S3" state is a voltage V3. The verify high voltage VH of the "S4" state is a voltage V4. The verify high voltage VH of the "S5" state is a voltage V5. The verify high voltage VH of the "S6" state is a voltage V6. The verify high voltage VH of the "S7" state is a voltage V7.

Next, the second verify low voltage VL2 of each write state will be described. The second verify low voltage VL2 of the "S1" state is a voltage V1L2. The voltage V1L2 is a voltage lower than the voltage V1. The second verify low voltage VL2 of the "S2" state is a voltage V2L2. The voltage V2L2 is a voltage higher than the voltage V1 and lower than the voltage V2. The second verify low voltage VL2 of the "S3" state is a voltage V3L2. The voltage V3L2 is a voltage higher than the voltage V2 and lower than the voltage V3. The second verify low voltage VL2 of the "S4" state is a voltage V4L2. The voltage V4L2 is a voltage higher than the voltage V3 and lower than the voltage V4. The second verify low voltage VL2 of the "S5" state is a voltage V5L2. The voltage V5L2 is a voltage higher than the voltage V4 and lower than the voltage V5. The second verify low voltage VL2 of the "S6" state is a voltage V6L2. The voltage V6L2 is a voltage higher than the voltage V5 and lower than the voltage V6. The second verify low voltage VL2 of the "S7" state is a voltage V7L2. The voltage V7L2 is a voltage higher than the voltage V6 and lower than the voltage V7.

Next, the first verify low voltage VL1 of each write state will be described. The first verify low voltage VL1 of the "S1" state is a voltage V1L1. The voltage V1L1 is a voltage lower than the voltage V1L2. As the first verify low voltage VL1 of the "S2" to "S7" states, the verify high voltage VH of the "S (N−1)" state (N is an integer of 2 or more and is a number allocated to the write state), i.e., a voltage V(N−1) is used. More specifically, the first verify low voltage VL1 of the "S2" state is the same voltage V1 as the verify high voltage VH of the "S1" state. The first verify low voltage VL1 of the "S3" state is the same voltage V2 as the verify high voltage VH of the "S2" state. The first verify low voltage VL1 of the "S4" state is the same voltage V3 as the verify high voltage VH of the "S3" state. The first verify low voltage VL1 of the "S5" state is the same voltage V4 as the verify high voltage VH of the "S4" state. The first verify low voltage VL1 of the "S6" state is the same voltage V5 as the verify high voltage VH of the "S5" state. The first verify low voltage VL1 of the "S7" state is the same voltage V6 as the verify high voltage VH of the "S6" state.

Figure 13:
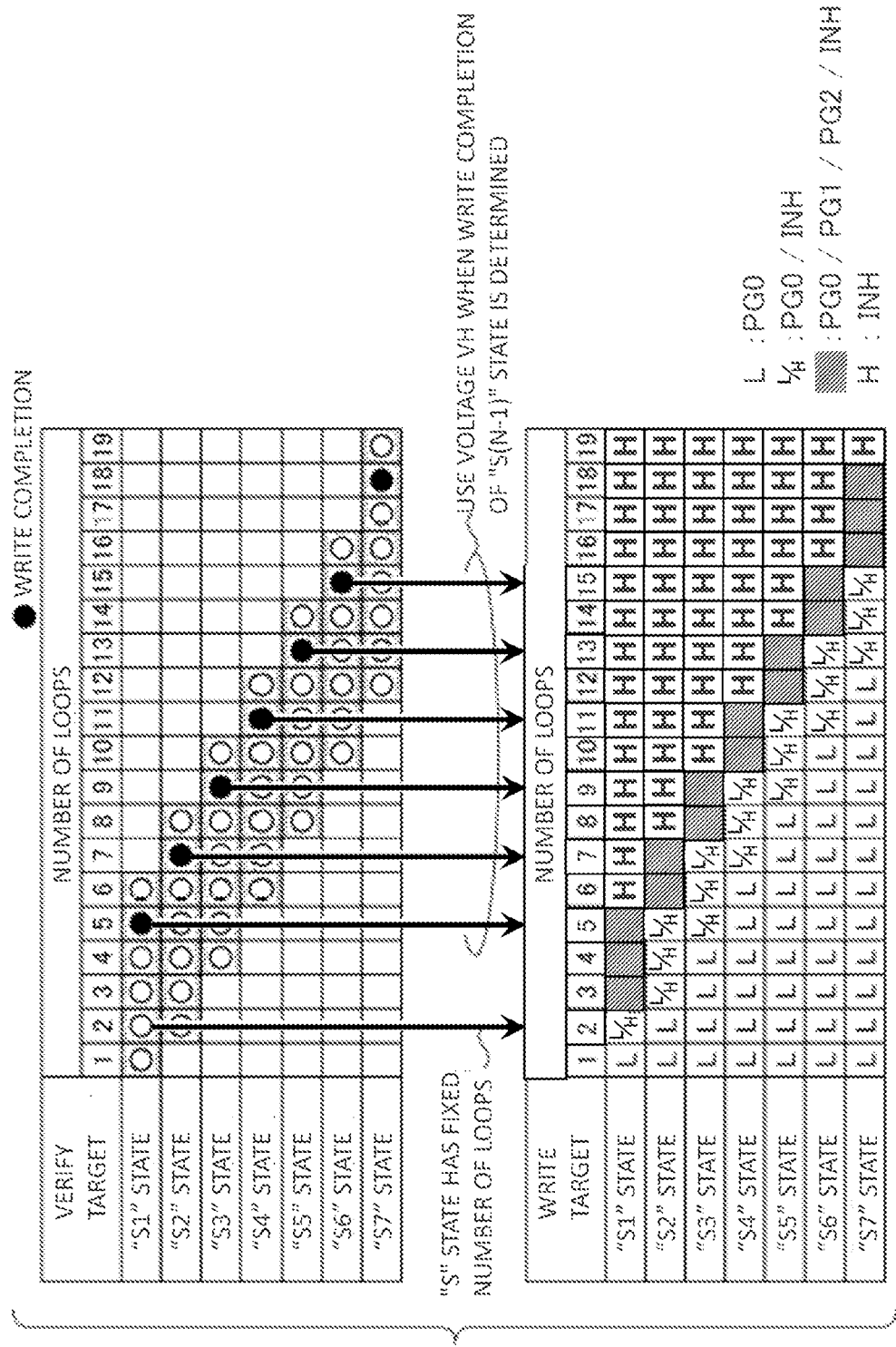
FIG. 13 is a diagram illustrating a relationship between the number of program loops and a verify operation in a write operation in the semiconductor memory device according to the first embodiment.

1.3.6 Specific Example of Timings to Execute VL1 Verify Operation and VL2 Verify Operation Next, a specific example of the timing to execute the VL1 verify operation in the first embodiment will be described with reference to FIG. 13. FIG. 13 is a diagram illustrating a relationship between the number of program loops and the VL1 verify operation in a write operation. The upper table illustrated in FIG. 13 is the same as FIG. 8. In each write state, the white circle is filled in a blank where the verify operation is set. Then, a black circle is filled in the program loop in which the sequencer 14 determines that a write operation of the write state is completed. The lower table illustrated in FIG. 13 application of three program conditions PG0 to PG2 and a program inhibition condition INH based on the result of the VL1 verify operation, the VL2 verify operation and the VH verify condition. For example, in the lower table, the "L" indicates application of the program condition PG0. The "L/H" indicates application of the program condition PG0 or the program inhibition condition INH. The hatching indicates application of the program condition PG0, the program condition PG1, the program condition PG2, or the program inhibition condition INH. The "H" indicates application of the program inhibition condition INH. The setting data as to applicability of the program condition PG1 or the program condition PG2 is stored in any one of the latch circuits ADL, BDL, CDR, DDL, or TDL of each sense amplifier unit SAU. Hereinafter, a case where setting data is stored in the latch circuit TDL will be described.

As illustrated in FIG. 13, first, in the first program loop, "L" level data is stored in the latch circuit TDL corresponding to each write state.

For example, in a case of the "S1" state, the number of program loops for executing the VL1 verify operation is preset. In the example illustrated in FIG. 13, in the second program loop, the VL1 verify operation using the voltage V1L1 corresponding to the "S1" state is executed. More specifically, in the second program loop, the sequencer 14 executes the VL1 verify operation using the voltage V1L1, the VL2 verify operation using the voltage V1L2, and the VH verify operation using the voltage V1 which correspond to the "S1" state, and the VL2 verify operation using the voltage V2L2 and the VH verify operation using the voltage V2 which correspond to the "S2" state. The sequencer 14 updates the data of the latch circuit TDL corresponding to the "S1" state based on the result of the VL1 verify operation using the voltage V1L1 corresponding to the "S1" state. As a result, of the latch circuit TDL corresponding to the "S1" state, the data of the latch circuit TDL corresponding to the fast cell which passes the VL1 verify operation is set to "L". Meanwhile, of the latch circuit TDL corresponding to the "S1" state, the data of the latch circuit TDL corresponding to the slow cell which fails the VL1 verify operation is set to "H".

In the fifth program loop, the sequencer 14 executes the verify operation corresponding to the "S1" state, the "S2" state, and the "S3" state. For example, in the fifth program loop, the sequencer 14 determines that the write operation corresponding to the "S1" state is completed. In this case, the write operation corresponding to the "S1" state in the sixth program loop may be omitted. The sequencer 14 regards the result of the VH verify operation using the voltage V1 corresponding to the "S1" state in the fifth program loop as the result of the VL1 verify operation corresponding to the "S2" state, and updates the data of the latch circuit TDL corresponding to the "S2" state. As a result, of the latch circuit TDL corresponding to the "S2" state, the data of the latch circuit TDL corresponding to the fast cell which passes the VH verify operation using the voltage V1 is set to "L". Meanwhile, of the latch circuit TDL corresponding to the "S2" state, the data of the latch circuit TDL corresponding to the slow cell which fails the VH verify operation using the voltage V1 is set to "H".

In the seventh program loop, the sequencer 14 executes the verify operation corresponding to the "S2" state, the "S3" state, and the "S4" state. For example, in the seventh program loop, the sequencer 14 determines that the write operation corresponding to the "S2" state is completed. In this case, the write operation corresponding to the "S2" state in the eighth program loop may be omitted. The sequencer 14 regards the result of the VH verify operation using the voltage V2 corresponding to the "S2" state in the seventh program loop as the result of the VL1 verify operation corresponding to the "S3" state, and updates the data of the latch circuit TDL corresponding to the "S3" state. As a result, of the latch circuit TDL corresponding to the "S3" state, the data of the latch circuit TDL corresponding to the fast cell which passes the VH verify operation using the voltage V2 is set to "L". Meanwhile, of the latch circuit TDL corresponding to the "S3" state, the data of the latch circuit TDL corresponding to the slow cell which fails the VH verify operation using the voltage V2 is set to "H".

In the ninth program loop, the sequencer 14 executes the verify operation corresponding to the "S3" state, the "S4" state, and the "S5" state. For example, in the ninth program loop, the sequencer 14 determines that the write operation corresponding to the "S3" state is completed. In this case, the write operation corresponding to the "S3" state in the tenth program loop may be omitted. The sequencer 14 regards the result of the VH verify operation using the voltage V3 corresponding to the "S3" state in the ninth program loop as the result of the VL1 verify operation corresponding to the "S4" state, and updates the data of the latch circuit TDL corresponding to the "S4" state. As a result, of the latch circuit TDL corresponding to the "S4" state, the data of the latch circuit TDL corresponding to the fast cell which passes the VH verify operation using the voltage V3 is set to "L". Meanwhile, of the latch circuit TDL corresponding to the "S4" state, the data of the latch circuit TDL corresponding to the slow cell which fails the VH verify operation using the voltage V3 is set to "H".

In the eleventh program loop, the sequencer 14 executes the verify operation corresponding to the "S4" state, the "S5" state, and the "S6" state. For example, in the eleventh program loop, the sequencer 14 determines that the write operation corresponding to the "S4" state is completed. In this case, the write operation corresponding to the "S4" state in the twelfth program loop may be omitted. The sequencer 14 regards the result of the VH verify operation using the voltage V4 corresponding to the "S4" state in the eleventh program loop as the result of the VL1 verify operation corresponding to the "S5" state, and updates the data of the latch circuit TDL corresponding to the "S5" state. As a result, of the latch circuit TDL corresponding to the "S5" state, the data of the latch circuit TDL corresponding to the fast cell which passes the VH verify operation using the voltage V4 is set to "L". Meanwhile, of the latch circuit TDL corresponding to the "S5" state, the data of the latch circuit TDL corresponding to the slow cell which fails the VH verify operation using the voltage V4 is set to "H".

In the thirteenth program loop, the sequencer 14 executes the verify operation corresponding to the "S5" state, the "S6" state, and the "S7" state. For example, in the thirteenth program loop, the sequencer 14 determines that the write operation corresponding to the "S5" state is completed. In this case, the write operation corresponding to the "S5" state in the fourteenth program loop may be omitted. The sequencer 14 regards the result of the VH verify operation using the voltage V5 corresponding to the "S5" state in the thirteenth program loop as the result of the VL1 verify operation corresponding to the "S6" state, and updates the data of the latch circuit TDL corresponding to the "S6" state. As a result, of the latch circuit TDL corresponding to the "S6" state, the data of the latch circuit TDL corresponding to the fast cell which passes the VH verify operation using the voltage V5 is set to "L". Meanwhile, of the latch circuit TDL corresponding to the "S6" state, the data of the latch circuit TDL corresponding to the slow cell which fails the VH verify operation using the voltage V5 is set to "H".

In the fifteenth program loop, the sequencer 14 executes the verify operation corresponding to the "S6" state and the "S7" state. For example, in the fifteenth program loop, the sequencer 14 determines that the write operation corresponding to the "S6" state is completed. In this case, the write operation corresponding to the "S6" state in the sixteenth program loop may be omitted. The sequencer 14 regards the result of the VH verify operation using the voltage V6 corresponding to the "S6" state in the fifteenth program loop as the result of the VL1 verify operation corresponding to the "S7" state, and updates the data of the latch circuit TDL corresponding to the "S7" state. As a result, of the latch circuit TDL corresponding to the "S7" state, the data of the latch circuit TDL corresponding to the fast cell which passes the VH verify operation using the voltage V6 is set to "L". Meanwhile, of the latch circuit TDL corresponding to the "S7" state, the data of the latch circuit TDL corresponding to the slow cell which fails the VH verify operation using the voltage V6 is set to "H". While an example of timings to execute the VL1 verify operation and the VL2 verify operation in the first embodiment is described, timings to execute the VL1 verify operation and the VL2 verify operation in the write operation are not limited thereto. For example, the sequencer 14 may execute the VL1 verify operation and the VL2 verify operation for a given write state in each program loop in which the write state is executed. In this case, each of the first verify low voltage VL1 and the second verify low voltage VL2 may be used to evaluate how the threshold voltage of the memory cell transistor MCsel is different from the voltage VH, and application of the three program conditions PG0 to PG2 and the program inhibition condition INH may be determined based on the results of the VL1 verify operation, the VL2 verify operation and the VH verify operation.

1.3.7 Flow of Program Operation

Figure 14:
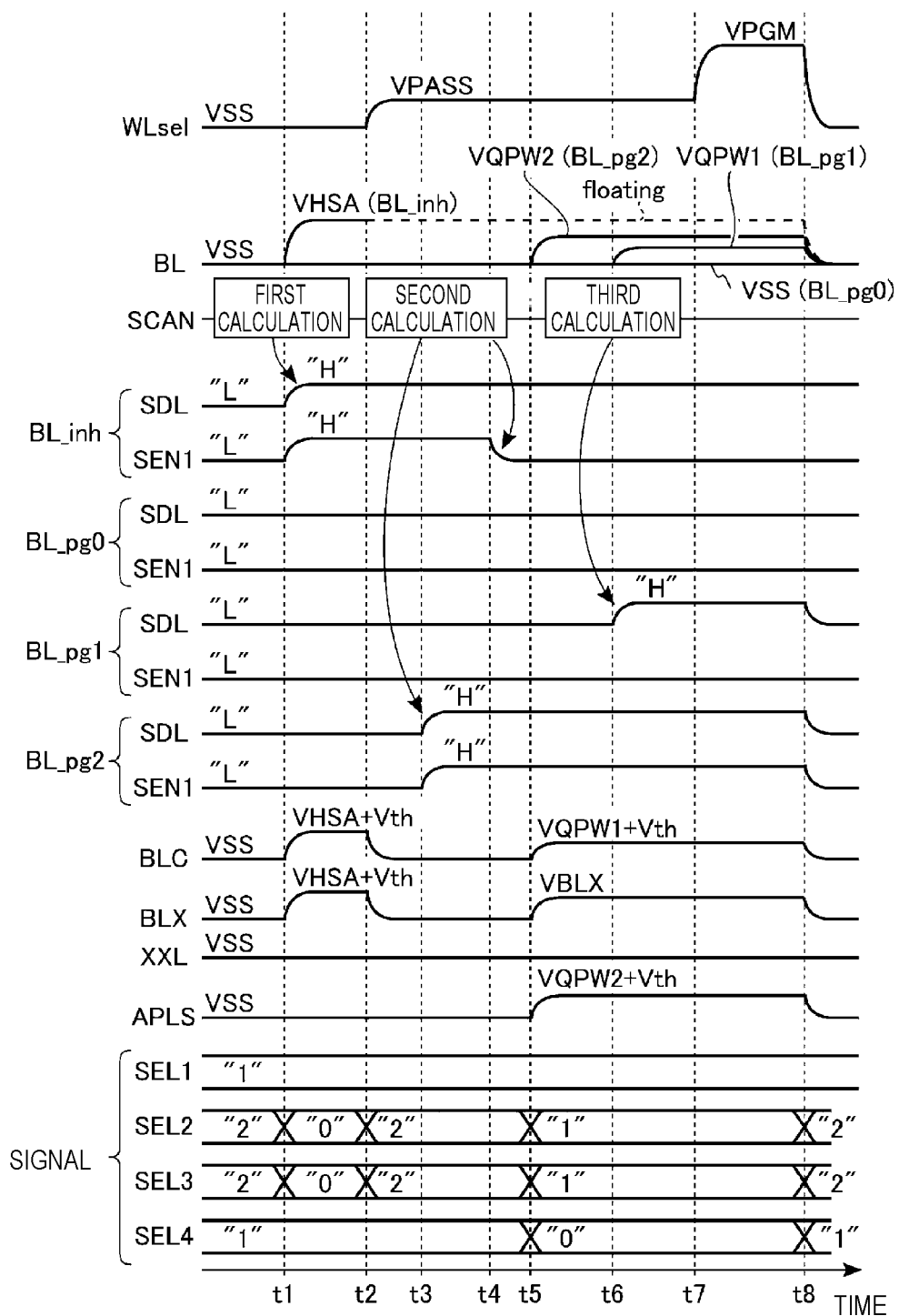
FIG. 14 is a timing chart illustrating various wirings and various signals in a program operation in the semiconductor memory device according to the first embodiment.

Next, an example of the flow of a program operation will be described with reference to FIGS. 14 to 19. FIG. 14 is a timing chart illustrating various wirings and various signals in a program operation. FIGS. 15 to 19 are diagrams illustrating an operation of the voltage generation circuit 16 and the sense amplifier unit SAU in a program operation.

As illustrated in FIG. 14, first, at the time t1, the row decoder 18 applies the voltage VSS to the word line WLsel. The sense amplifier unit SAU executes a first calculation processing to update the data of the latch circuit SDL. Hereinafter, an operation of updating the data of the latch circuit SDL by a calculation processing will also be referred to as "scan SCAN". In the first calculation processing, "H" level data is stored in the corresponding latch circuit SDL in a case of the program-inhibit, and "L" level data is stored in the corresponding latch circuit SDL in a case of the program-target. That is, the "H" level data is stored in the latch circuit SDL corresponding to the bit line BL_inh. Further, the "L" level data is stored in the latch circuit SDL corresponding to the bit lines BL_pg0, BL_pg1 and BL_pg2.

The node SEN1 is charged to the "H" level based on the "H" level data stored in the latch circuit SDL. More specifically, for example, in the sense circuit SA, the transistors 39 and 40 are turned on, and the "H" level voltage VHLB is applied to the node SEN1 from the precharge circuit PCC.

Next, the transistors 39 and 43 are turned on. In this state, for example, the transistor 62 of the latch circuit SDL is turned on. Thus, when the latch circuit SDL stores the "L" level data, the voltage of the bus LBUS is set to the "H" level. Further, when the latch circuit SDL stores the "H" level data, the voltage of the bus LBUS is set to the "L" level. When the bus LBUS is at the "H" level, the transistor 44 is turned on, so that the node SEN1 is discharged via the transistors 39, 43, and 44. Further, when the bus LBUS is at the "L" level, the transistor 44 is turned off, so that the node SEN1 is not discharged. That is, when the "H" level data is stored in the latch circuit SDL, the node SEN1 is set to the "H" level.

The sequencer 14 sets the signal SEL1 to "1". Thus, the first input terminal is selected in the selector circuit 80 of the voltage generation circuit 16. As a result, the voltage VSS is applied to the node XXL.

The sequencer 14 sets the signal SEL2 to "0". Thus, the $0^{th}$ input terminal is selected in the selector circuit 81 of the voltage generation circuit 16. As a result, the voltage VHSA+Vth is applied to the node BLX.

The sequencer 14 sets the signal SEL3 to "0". Thus, the $0^{th}$ input terminal is selected in the selector circuit 82 of the voltage generation circuit 16. As a result, the voltage VHSA+Vth is applied to the node BLC.

The sequencer 14 sets the signal SEL4 to "1". Thus, the first input terminal is selected in the selector circuit 83 of the voltage generation circuit 16. As a result, the voltage VSS is applied to the node APLS.

The voltages of the bit lines BL_inh, BL_pg0, BL_pg1 and BL_pg2 at the time t1 will be described with reference to FIGS. 15 and 16.

Figure 15:
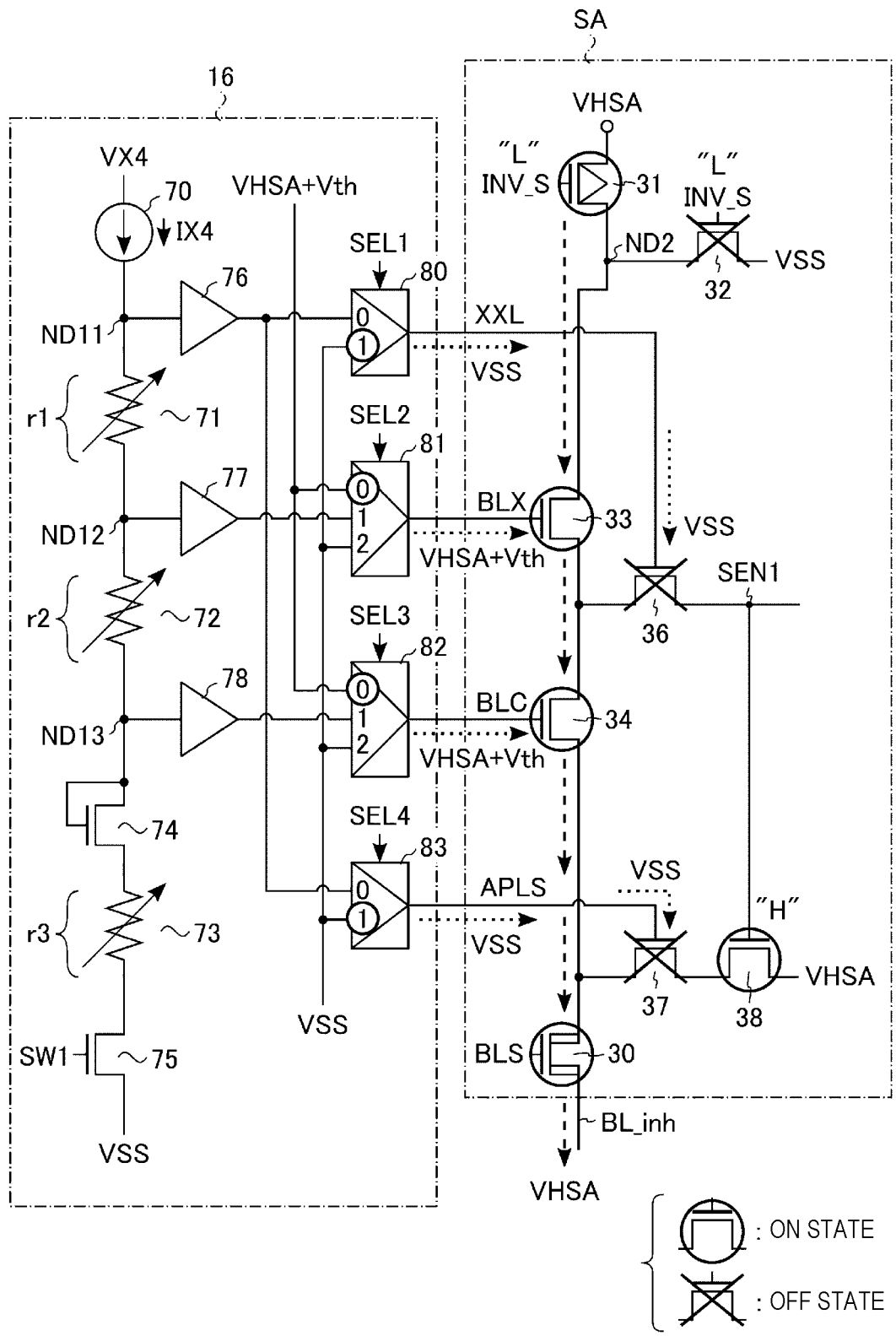
FIGS. 15-19 are diagrams illustrating an operation of the voltage generation circuit and the sense amplifier unit in a program operation in the semiconductor memory device according to the first embodiment.

As illustrated in FIG. 15, in the sense amplifier unit SAU connected to the bit line BL_inh, the "H" level data is stored in the latch circuit SDL. Therefore, the node INV_S is set to the "L" level. As a result, the transistor 31 is turned on. The voltage VHSA+Vth is applied to the gates of the transistors 33 and 34. Thus, the transistors 33 and 34 are turned on to enable the transfer of the voltage VHSA. Further, the transistor 30 is turned on. As a result, the sense amplifier unit SAU applies the voltage VHSA as the voltage VINH to the bit line BL_inh via the transistors 31, 33, 34, and 30.

Figure 16:
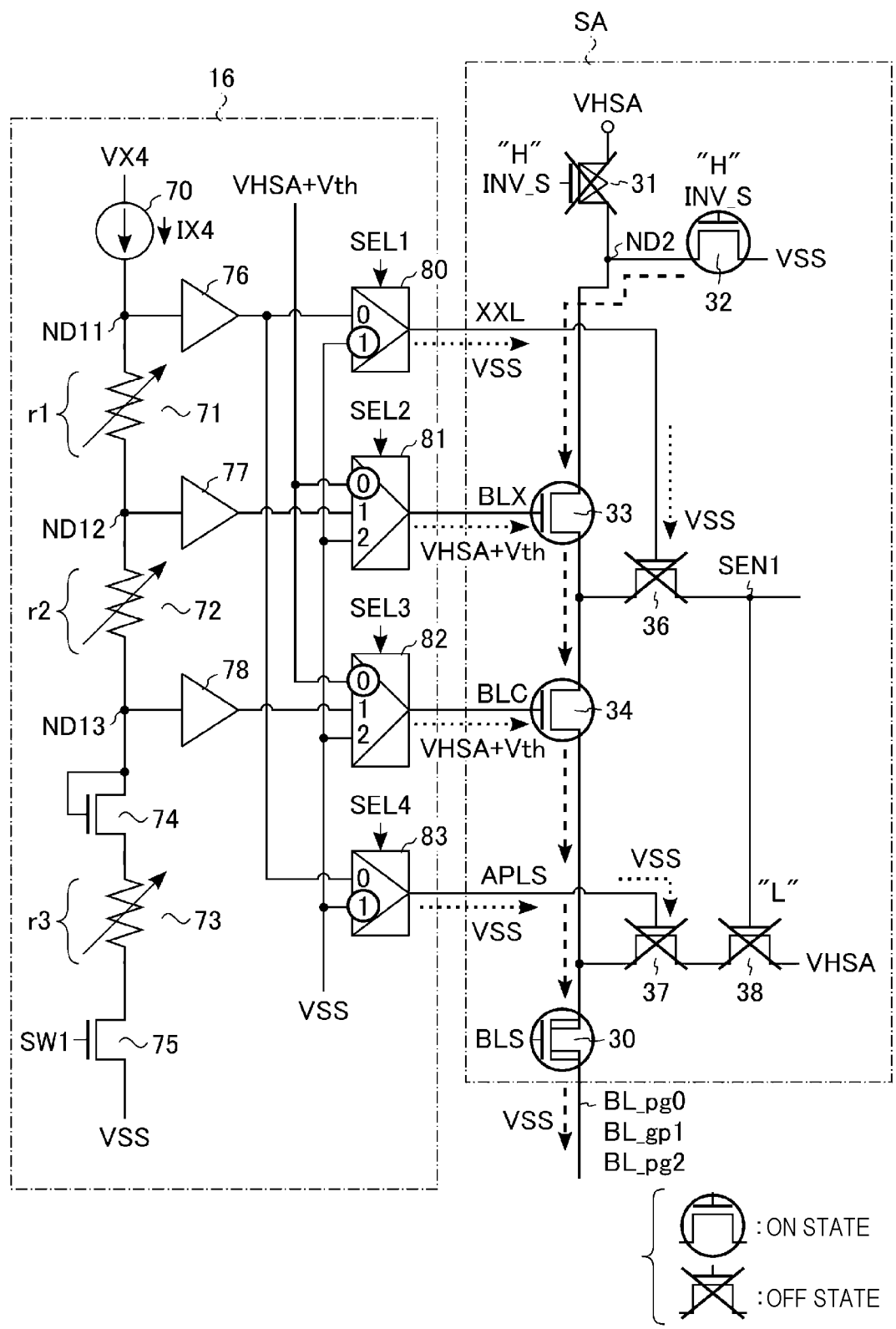

As illustrated in FIG. 16, in the sense amplifier unit SAU connected to the bit lines BL_pg0, BL_pg1 and BL_pg2, the "L" level data is stored in the latch circuit SDL. Therefore, the node INV_S is set to the "H" level. As a result, the transistor 32 is turned on. The transistors 33, 34, and 30 are turned on. Therefore, the sense amplifier unit SAU applies the voltage VSS to the bit lines BL_pg0, BL_pg1, and BL_pg2 via the transistors 32, 33, 34, and 30.

Next, at the time t2 illustrated in FIG. 14, the row decoder 18 applies a voltage VPASS to the word line WLsel. The voltage VPASS is a voltage that turns on the corresponding memory cell transistor MC regardless of the threshold voltage of the memory cell transistor MC.

The sequencer 14 sets the signal SEL2 to "2". Thus, the second input terminal is selected in the selector circuit 81 of the voltage generation circuit 16. As a result, the voltage VSS is applied to the node BLX.

The sequencer 14 sets the signal SEL3 to "2". Thus, the second input terminal is selected in the selector circuit 82 of the voltage generation circuit 16. As a result, the voltage VSS is applied to the node BLC.

Figure 17:
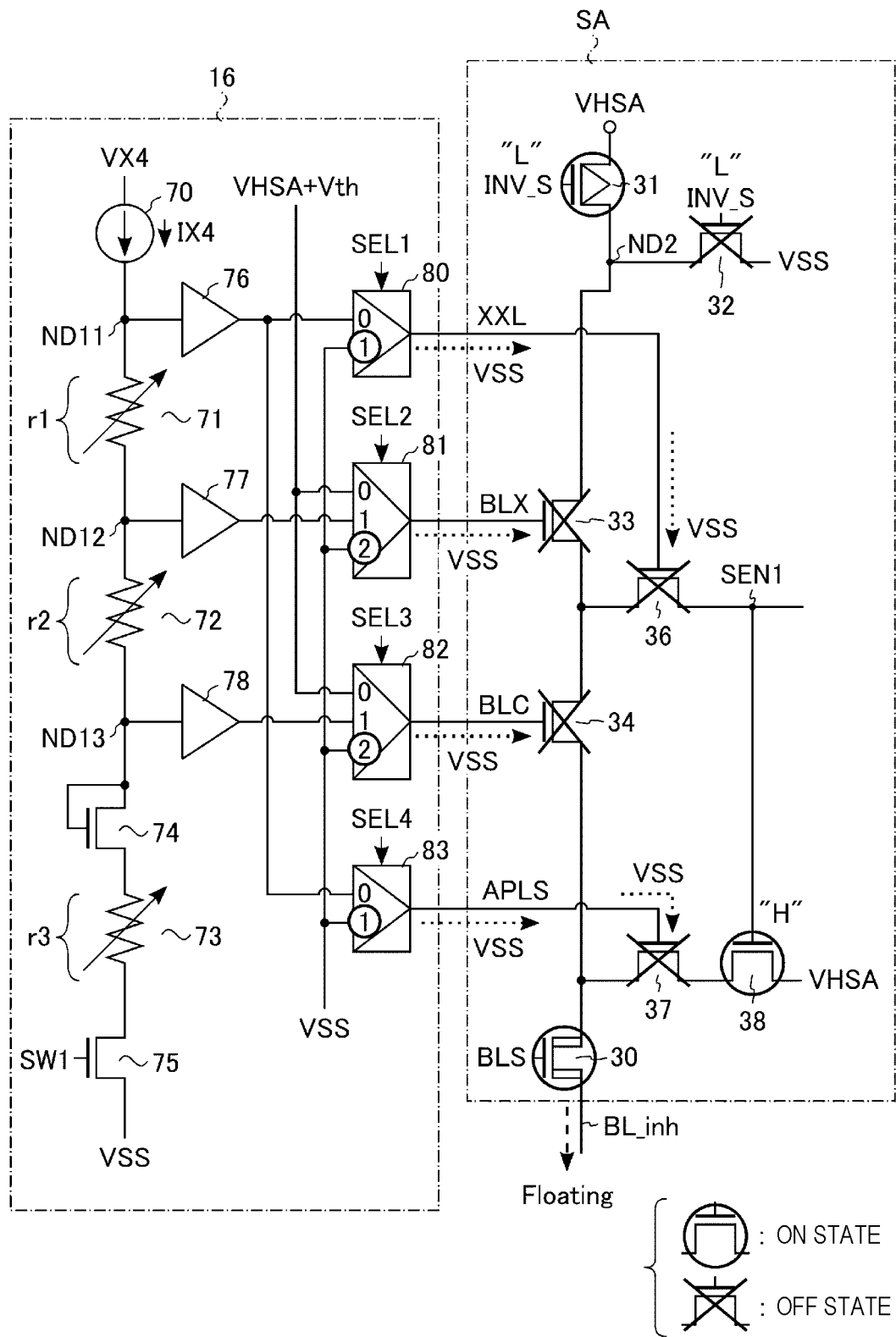

As illustrated in FIG. 17, in the sense amplifier unit SAU the transistors 33 and 34 are turned off. Therefore, the bit line BL_inh is in the electrically floating state.

Next, at the time t3 illustrated in FIG. 14, the sense amplifier unit SAU executes a second calculation processing to update the data of the latch circuit SDL. In the second calculation processing, the logical sum of the inverted data of the setting data of the voltages VQPW1 and VQPW2 stored in the latch circuit TDL described with reference to FIG. 13 and of the data stored in the latch circuit SDL is calculated. Thus, the "H" level data is stored in the latch circuit SDL corresponding to the bit lines BL_inh and BL_pg2. Further, the "L" level data is stored in the latch circuit SDL corresponding to the bit lines BL_pg0 and BL_pg1. Similar to the time t1, the node SEN1 is charged to the "H" level based on the "H" level data stored in the latch circuit SDL.

Next, at the time t4 illustrated in FIG. 14, the voltage of the node SEN1 corresponding to the bit line BL_inh is set to the "L" level based on the second calculation processing. Meanwhile, the voltage of the node SEN1 corresponding to the bit line BL_pg2 is maintained at the "H" level.

Next, at the time t5 illustrated in FIG. 14, the sequencer 14 sets the signal SEL2 to "1". Thus, the first input terminal is selected in the selector circuit 81 of the voltage generation circuit 16. As a result, a voltage VBLX is applied to the node BLX.

The sequencer 14 sets the signal SEL3 to "1". Thus, the first input terminal is selected in the selector circuit 82 of the voltage generation circuit 16. As a result, a voltage VQPW1+Vth is applied to the node BLC.

The sequencer 14 sets the signal SEL4 to "0". Thus, the $0^{th}$ input terminal is selected in the selector circuit 83 of the voltage generation circuit 16. As a result, a voltage VQPW2+Vth is applied to the node APLS.

Figure 18:
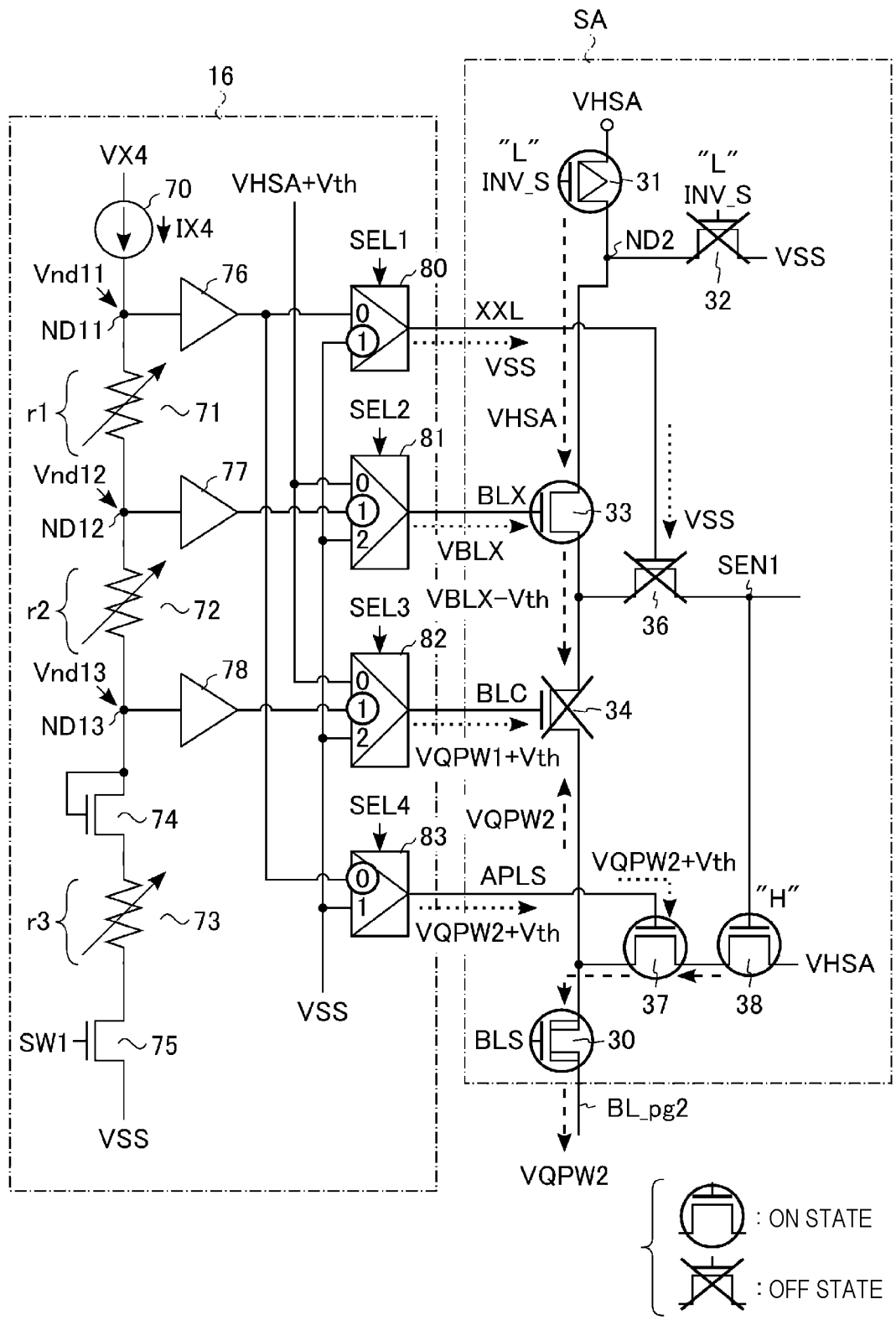

As illustrated in FIG. 18, in the voltage generation circuit 16, the resistance values r1 to r3 of the variable resistance elements 71 to 73 are adjusted so that each of the voltages Vnd11 to Vnd13 is set to the voltage VQPW2+Vth, the voltage VBLX, and the voltage VQPW1+Vth. The voltage VQPW2+Vth, the voltage VBLX, and the voltage VQPW1+Vth have a relationship of "VQPW2+Vth">"VBLX">"VQPW1+Vth".

In the sense amplifier unit SAU connected to the bit line BL_pg2, the transistor 31 is turned on because the node INV_S is at the "L" level. Therefore, the voltage VHSA is applied to one end of the transistor 33. The voltage VBLX is applied to the gate of the transistor 33. Therefore, a voltage VBLX-Vth is applied to one end of the transistor 34. Further, the transistor 38 is turned on because the node SEN1 is at the "H" level. Then, the voltage VQPW2+Vth is applied to the gate of the transistor 37. Therefore, the voltage VQPW2 is applied to the other end of the transistor 34. The voltage VQPW1+Vth is applied to the gate of the transistor 34. The transistor 34 is cut off because the voltage VQPW1+Vth is lower than the voltage VQPW2 and the voltage VBLX-Vth. Therefore, the sense amplifier unit SAU applies the voltage VQPW2 to the bit line BL_pg2.

Next, at the time t6 illustrated in FIG. 14, the sense amplifier unit SAU executes a third calculation processing to update the data of the latch circuit SDL. In the third calculation processing, the logical sum of the setting data of the voltages VQPW1 and VQPW2 stored in the latch circuit TDL and the data stored in the latch circuit SDL is calculated. Thus, the "H" level data is stored in the latch circuit SDL corresponding to the bit lines BL_inh, BL_pg1 and BL_pg2.

Figure 19:
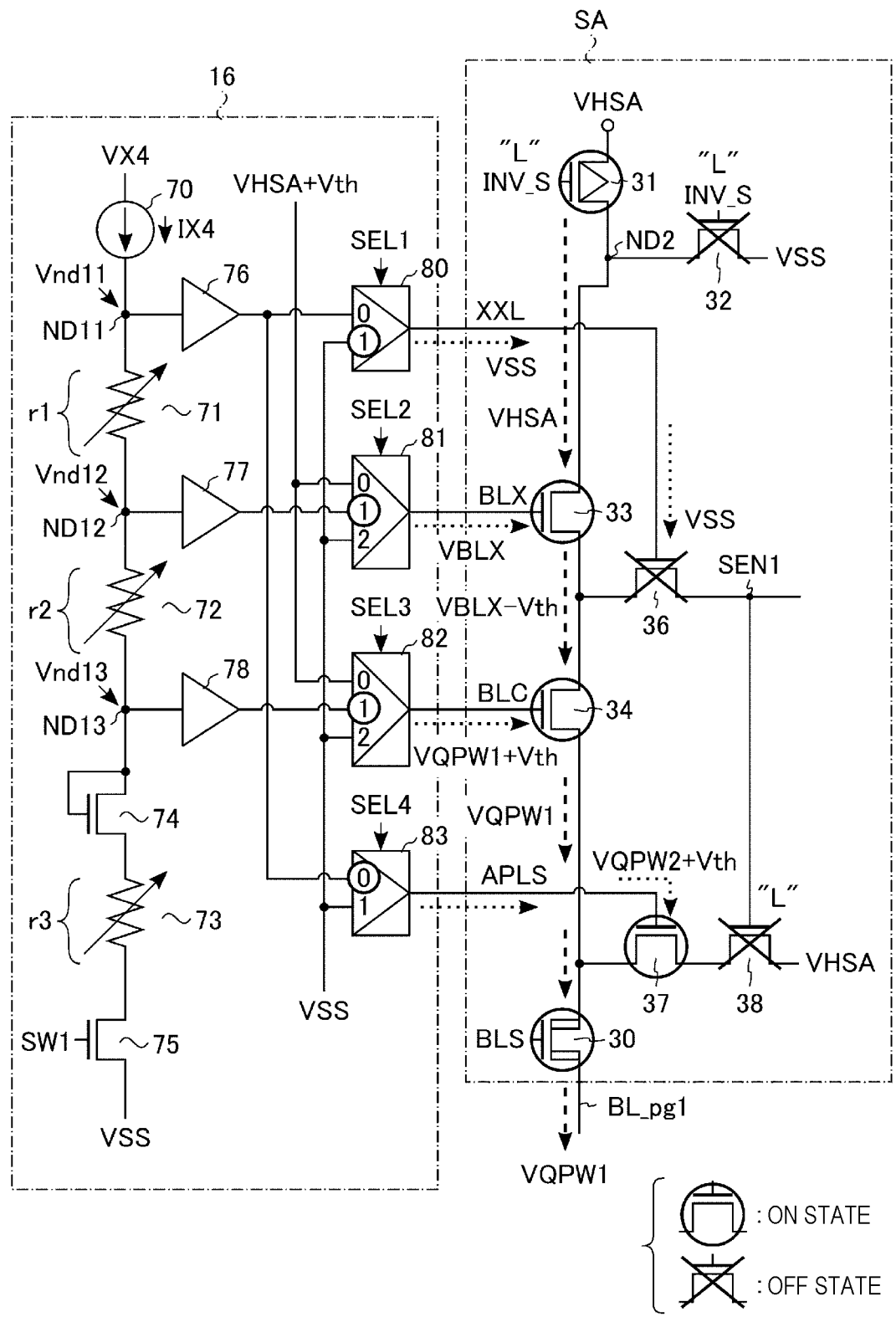

As illustrated in FIG. 19, in the sense amplifier unit SAU connected to the bit line BL_pg1, the transistor 31 is turned on because the node INV_S is at the "L" level. Therefore, the voltage VHSA is applied to one end of the transistor 33. Then, the voltage VBLX is applied to the gate of the transistor 33. Therefore, the voltage VBLX-Vth is applied to one end of the transistor 34. Further, the transistor 38 is turned off because the node SEN1 is at the "L" level. Therefore, the voltage VQPW2 is not applied to the other end of the transistor 34. The transistor 34 clamps the voltage of the bit line BL_pg1 to the voltage VQPW1 based on the voltage VQPW1+Vth applied to the gate. That is, the sense amplifier unit SAU applies the voltage VQPW1 to the bit line BL_pg1.

Next, at the time t7 illustrated in FIG. 14, the row decoder 18 applies the voltage VPGM to the word line WLsel. The program voltage VPGM is applied to the word line WLsel during the period from the time t6 to the time t7. During this time, the sense amplifier 19 applies the voltage VSS to the bit line BL_pg0, applies the voltage VPQW1 to the bit line BL_pg1, applies the voltage VQPW2 to the bit line BL_pg2, and applies the voltage VINH (=VHSA) to the bit line BL_inh. Thus, electrons based on the voltage of the channel are injected into the charge storage layer of the memory cell transistor MCsel.

Thereafter, at the time t8, a recovery operation is performed and each wiring is reset. The sequencer 14 sets the signals SEL1 to SEL4 to "1", "2", "2", and "1", respectively.

1.3.8 Flow of Write Operation

Figure 20:
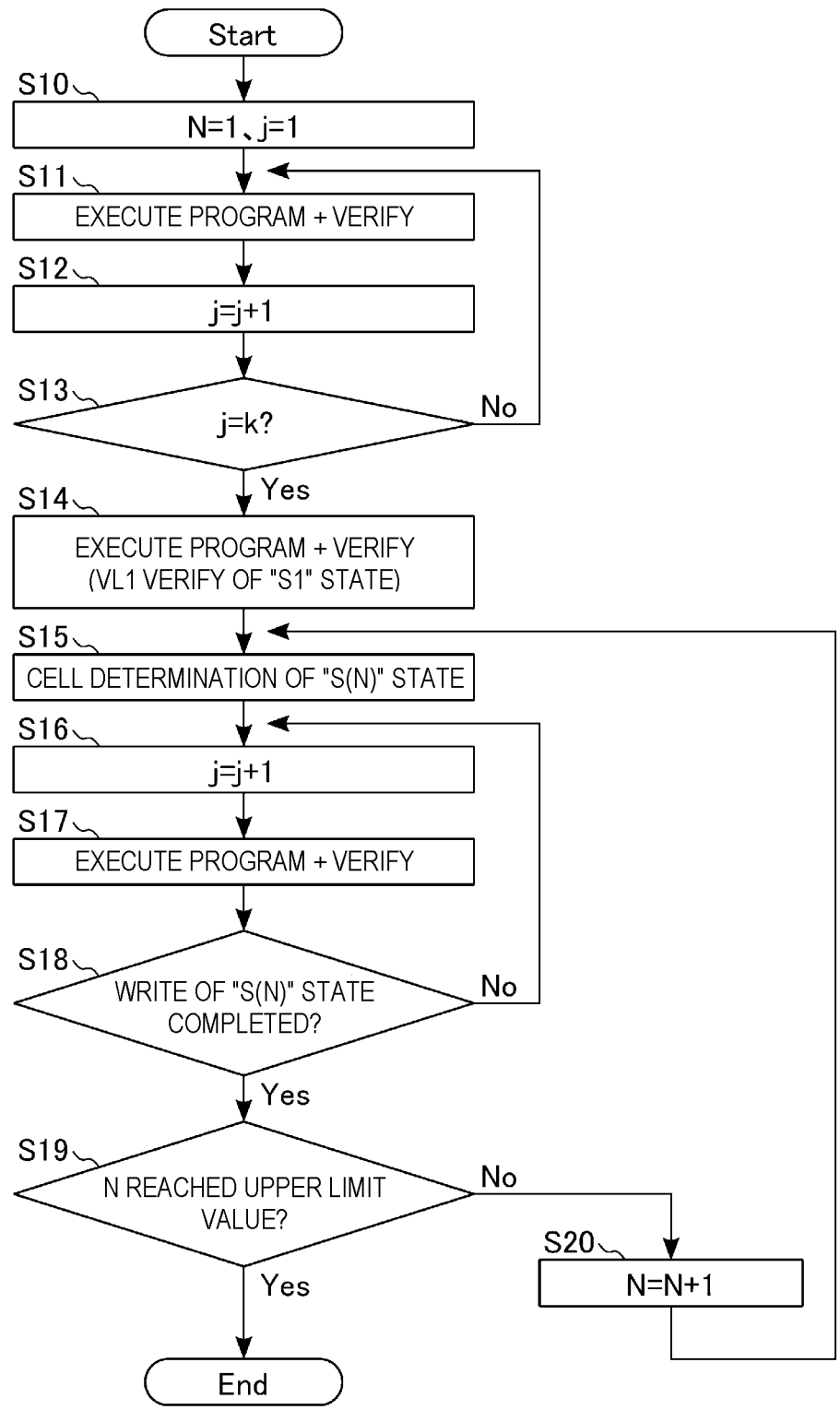
FIG. 20 is a flowchart of a write operation in the semiconductor memory device according to the first embodiment.

Next, an example of the flow of a write operation will be described with reference to FIG. 20. FIG. 20 is a flowchart of a write operation. In the following description, a variable j (j is an integer of 1 or more) is used as the count number (number of times) of program loops. A variable k (k is an integer of 1 or more) is used as the count number of program loops in which the VL1 verify operation of the "S1" state is set. The variable j is, for example, a variable controlled by a counter provided in the sequencer 14. The variable j is incremented as the program loop is repeated. The variable k is a preset fixed value.

As illustrated in FIG. 20, first, the sequencer 14 sets the variable j=1. Further, the sequencer 14 sets N=1 as the number of the write state for executing the cell determination (step S10).

The sequencer 14 executes the program operation and the verify operation corresponding to the first program loop (step S11).

The sequencer 14 increments the variable j so that j=j+1 (step S12).

The sequencer 14 checks whether or not the variable j reaches the variable k (step S13).

When j=k is not established (step S13_No), i.e., when the number of program loops j does not reach the preset variable k, the sequencer 14 proceeds to S11.

Meanwhile, when j=k is established (step S13_Yes), i.e., when the number of program loops j reaches the preset variable k, the sequencer 14 also executes the VL1 verify operation corresponding to the "S1" state in the verify operation in the next $j^{th}$ program loop (step S14).

The sequencer 14 executes the cell determination of the "S (N)" state (step S15). More specifically, when N=1 is established, the sequencer 14 executes the cell determination of the "S1" state based on the result of the VL1 verify operation. Further, when N≥2 is established, the sequencer 14 executes the cell determination of the "S(N)" state based on the result of the VH verification operation of the "S(N-1)" state.

The sequencer 14 increments the variable j so that j=j+1 (step S16).

The sequencer 14 executes the program operation and the verify operation corresponding to the $j^{th}$ program loop (step S17).

The sequencer 14 executes the detection operation and determines whether or not the write operation of the "S (N)" state is completed (step S18).

When it is determined that the write operation of the "S(N)" state is not completed (step S18_No), the sequencer 14 proceeds to S16.

Meanwhile, when it is determined that the write operation of the "S(N)" state is completed (step S18_Yes), the sequencer 14 checks whether or not N reaches the upper limit value (highest write state) (step S19). That is, the sequencer 14 checks whether or not the write operation of all the states is completed.

When N does not reach the upper limit value (step S19_No), the sequencer 14 increments N so that N=N+1 (step S20). Thereafter, the sequencer 14 proceeds to S15.

Meanwhile, when N reaches the upper limit value (step S19_Yes), the sequencer 14 ends the write operation.

1.4 Effect Related to Present Embodiment

The semiconductor memory device according to the above embodiment may improve reliability. Hereinafter, this effect will be described in detail.

In a semiconductor memory device, data is determined based on whether or not the threshold voltage of the memory cell transistor MC exceeds a read voltage applied to the corresponding word line WLsel. The threshold voltage of the memory cell transistor MC is increased through the program operation. It is ideal that the threshold voltages of the memory cell transistors MC corresponding to a given write state converge to a value which sufficiently exceeds the verify voltage of the given write state but does not interfere with the verify voltage of the higher write state. The threshold voltages of a plurality of memory cell transistors MC after a write operation have deviations close to a normal distribution. Such deviations between the threshold voltages of the memory cell transistors MC may occur because of deviations in the write characteristics of the memory cell transistors MC or the step-up width of the program voltage. In order to speed up the write operation, the step-up width of the program voltage may be increased. However, increasing the step-up width of the program voltage may cause the threshold voltage distribution of the memory cell transistors MC to be enlarged.

Accordingly, the semiconductor memory device 1 according to the present embodiment sets three types of verify voltages (first verify low voltage VL1, second verify low voltage VL2, and verify high voltage VH) for each write state. The voltages VL1, VL2, and VH have a relationship of VL1<VL2<VH. In the first verify operation using the first verify low voltage VL1, the memory cell transistor MC (fast cell) in which an increase in the threshold voltage due to the program operation is relatively large and the memory cell transistor MC (slow cell) in which an increase in the threshold voltage is relatively small is distinguished. Then, different program conditions may be applied to the fast cell and the slow cell based on the VL2 verify operation using the second verify low voltage VL2 and the VH verify operation using the verify high voltage VH. Thus, deviations in an increase in the threshold voltage of the fast cell and an increase in the threshold voltage of the slow cell may be reduced.

For example, the semiconductor memory device 1 applies the program condition PG0 to the memory cell transistor MC (including both the slow cell and the fast cell) which fails the VL2 verify operation in the next program operation. The semiconductor memory device 1 applies the program condition PG1 to the slow cell which passes the VL2 verify operation and fails the VH verify operation in the next program operation as a final program operation. The semiconductor memory device 1 applies the program condition PG2 to the fast cell which passes the VL2 verify operation and fails the VH verify operation in the next program operation as a final program operation. The semiconductor memory device 1 sets the memory cell transistor MC (including both the slow cell and the fast cell) which passes the VH verify operation to be program-inhibited. Then, the semiconductor memory device 1 applies the program inhibition condition INH in the next program operation. The program condition PG0, the program condition PG1, the program condition PG2, and the program inhibition condition INH have different voltages of the bit lines BL in the program operation, respectively. The voltages of the bit lines BL have a relationship of BL_pg0<BL_pg1<BL_pg2<BL_inh. The semiconductor memory device 1 may control an increase in the threshold voltage of the memory cell transistor MC based on the voltages of the bit lines BL.

More specifically, the semiconductor memory device 1 may reduce an increase in the threshold voltage of the memory cell transistor MC (including both the slow cell and the fast cell) which passes the VL2 verify operation and fails the VH verify operation as compared with an increase in the threshold voltage of the memory cell transistor MC which fails the VL2 verify operation by making the voltages of the bit lines BL_pg1 and BL_pg2 to be higher than the voltage of the bit line BL_pg0. Furthermore, the semiconductor memory device 1 may reduce deviations in an increase in the threshold voltage of the slow cell and an increase in the threshold voltage of the fast cell in the program operation of the memory cell transistor MC which passes the VL2 verification operation and fails the VH verify operation by making the voltage of the bit line BL_pg1 be lower than the voltage of the bit line BL_pg2.

Thus, deviations between the threshold voltages of the plurality of memory cell transistors MC provided in the write state may be reduced. Furthermore, a possibility that the threshold voltage becomes equal to or less than the voltage VH (does not reach the voltage VH) in the final program operation of the slow cell may be reduced. Accordingly, the reliability of the semiconductor memory device 1 may be improved.

Further, with the configuration according to the present embodiment, the verify high voltage VH of an immediately preceding "S(N−1)" state may be allocated as the first verify low voltage VL1 of the "S(N)" state (N is an integer of 2 or more). This may simplify the verify operation. Accordingly, a deterioration in the processing performance of the semiconductor memory device 1 may be prevented.

Further, with the configuration according to the present embodiment, the sense amplifier 19 may apply different voltages to the respective bit lines BL_pg0, BL_pg1, BL_pg2, and BL_inh in the program operation. For example, the sense amplifier 19 may apply the voltage VSS to the bit line BL_pg0, apply the voltage VQPW1 to the bit line BL_pg1, apply the voltage VQPW2 to the bit line BL_pg2, and apply the voltage VHSA to the bit line BL_inh.

Furthermore, with the configuration according to the present embodiment, in the voltage generation circuit 16, the voltages VQPW1+Vth and VQPW2+Vth corresponding respectively to the voltages VQPW1 and VQPW2 may be generated by voltage division based on the plurality of variable resistance elements 71 to 73 connected in series to one power supply. Therefore, a voltage relationship of VQPW1+Vth<VQPW2+Vth may be maintained regardless of manufacturing process deviations. Accordingly, the reliability of the semiconductor memory device 1 may be improved.

2. Second Embodiment

Next, a second embodiment will be described. In the second embodiment, two examples for setting the first verify low voltage VL1 are illustrated. Hereinafter, differences from the first embodiment will be mainly described.

2.1 First Example

First, a first example will be described. In the first example, a case where, in one or more write states, the VL1 verification operation is not executed, i.e., the cell determination for distinguishing between the slow cell and the fast cell is not executed will be described. For example, when the number of program loops is small, a deviation between the threshold voltage of the slow cell and the threshold voltage of the fast cell is small. Therefore, the cell determination may be omitted in the write states where verify high voltage VH is relatively low. In the write state in which the cell determination is not executed, the PG2 program operation is executed to use the voltage VQPW2 in the memory cell transistor MCsel in which the threshold voltage exceeds the voltage VL2 and is equal to or less than the voltage VH.

First, an example of setting the verify voltage will be described with reference to FIG. 21. FIG. 21 is a table illustrating an example of setting the verify voltage.

As illustrated in FIG. 21, for example, the first verify low voltage VL1 is not set in the "S1" to "S3" states. That is, the sequencer 14 does not execute the VL1 verify operation, i.e., the cell determination in the "S1" to "S3" states. The sequencer 14 executes the cell determination in the "S4" to "S7" states. Other verify voltage settings are the same as in FIG. 12 of the first embodiment. There may be one or more write states in which the first verify low voltage VL1 is not set.

Figure 22:
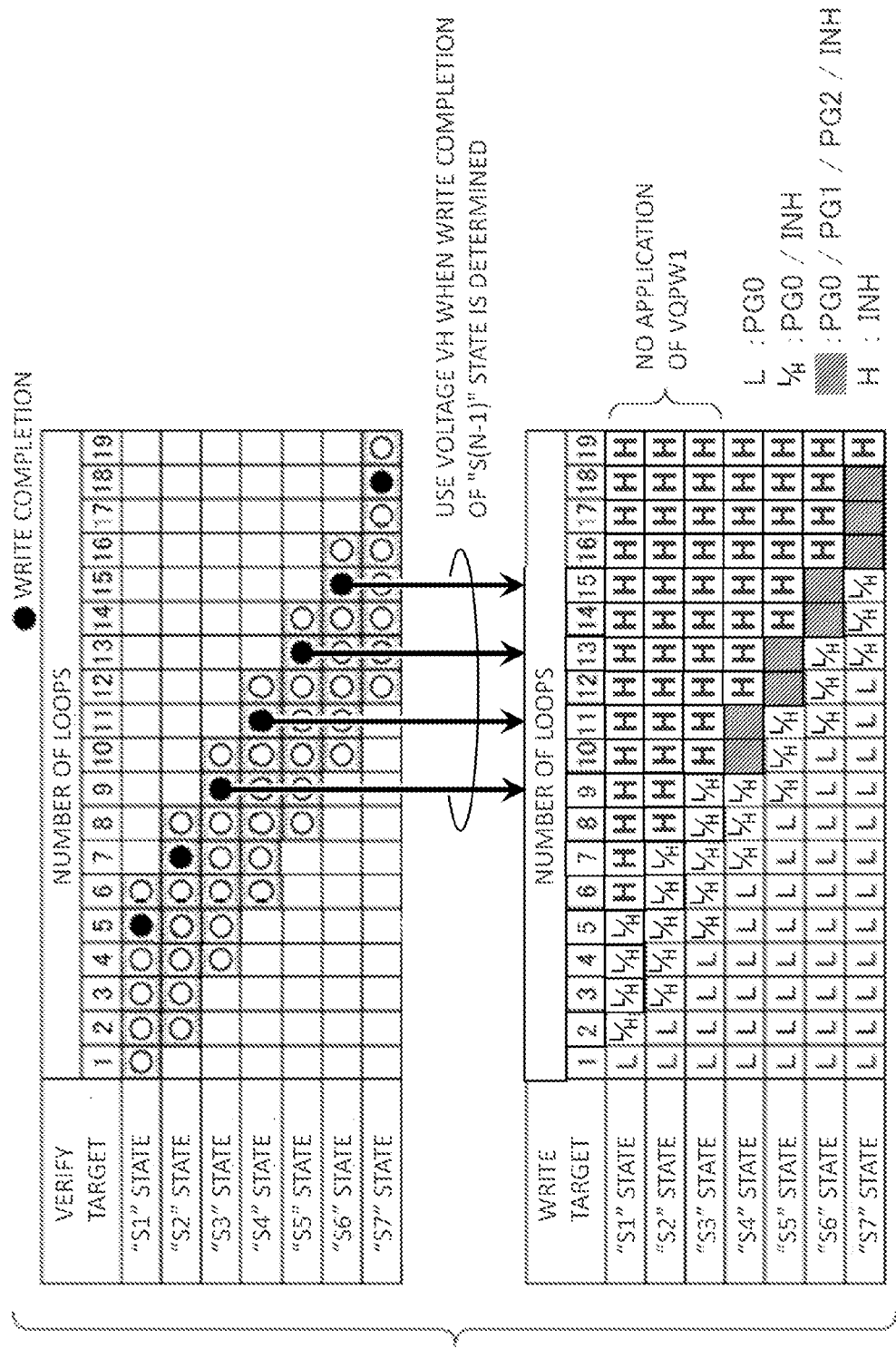
FIG. 22 is a diagram illustrating a relationship between the number of program loops and a verify operation in a write operation in the semiconductor memory device according to the first example of the second embodiment.

Next, a specific example of the timing to execute the VL1 verify operation will be described with reference to FIG. 22. FIG. 22 is a diagram illustrating a relationship between the number of program loops in a write operation and the VL1 verify operation. The example illustrated in FIG. 22 illustrates a case where the verify voltage setting described with reference to FIG. 21 is applied.

As illustrated in FIG. 22, first, in the first program loop, "L" level data is stored in the latch circuit TDL corresponding to each write state. Since the cell determination is not executed in the "S1" to "S3" states, the data of the latch circuit TDL is maintained at "L". Thus, the PG1 program operation using the voltage VQPW1 is not executed. The "S4" to "S7" states are the same as the description with reference to FIG. 13 of the first embodiment.

2.2 Second Example

Next, a second example will be described. In the second example, a case where the verify high voltage VH in the "S(N−1)" state is not used for the first verify low voltage VL1 will be described. That is, a case where the voltage VL1 is set individually in each write state will be described. For example, the sequencer 14 executes the VL1 verify operation of the "S2" to "S7" states in the verify operation of the program loop after it is determined that the write operation of the "S(N−1)" state is completed.

First, an example of setting the verify voltage will be described with reference to FIG. 23. FIG. 23 is a table illustrating an example of setting the verify voltage.

The first verify low voltage VL1 of each write state will be described. Other verify voltage settings are the same as in FIG. 12 of the first embodiment.

As illustrated in FIG. 23, the first verify low voltage VL1 of the "S1" state is the voltage V1L1. The voltage V1L1 is a voltage lower than the voltage V1L2. The first verify low voltage VL1 in the "S2" state is the voltage V2L1. The voltage V2L1 is a voltage higher than the voltage V1L2 and lower than the voltage V2L2. The voltage V2L1 may be a voltage higher or lower than the voltage V1.

The first verify low voltage VL1 of the "S3" state is a voltage V3L1. The voltage V3L1 is a voltage higher than the voltage V2L2 and lower than a voltage V3L2. The voltage V3L1 may be a voltage higher or lower than the voltage V2.

The first verify low voltage VL1 of the "S4" state is a voltage V4L1. The voltage V4L1 is a voltage higher than the voltage V3L2 and lower than a voltage V4L2. The voltage V4L1 may be a voltage higher or lower than the voltage V3.

The first verify low voltage VL1 of the "S5" state is a voltage V5L1. The voltage V5L1 is a voltage higher than the voltage V4L2 and lower than a voltage V5L2. The voltage V5L1 may be a voltage higher or lower than the voltage V4.

The first verify low voltage VL1 of the "S6" state is a voltage V6L1. The voltage V6L1 is a voltage higher than the voltage V5L2 and lower than a voltage V6L2. The voltage V6L1 may be a voltage higher or lower than the voltage V5.

The first verify low voltage VL1 of the "S7" state is a voltage V7L1. The voltage V7L1 is a voltage higher than the voltage V6L2 and lower than a voltage V7L2. The voltage V7L1 may be a voltage higher or lower than the voltage V6.

2.3 Effect Related to Present Embodiment

With the configuration according to the present embodiment, the same effect as that of the first embodiment may be obtained.

3. Modifications, Etc

The semiconductor memory device according to the above embodiment includes a memory cell array (17) including a plurality of memory cells (MC), a word line (WL) connected to the plurality of memory cells, a plurality of bit lines (BL) connected respectively to the plurality of memory cells, a sense amplifier (19) connected to the plurality of bit lines, and a controller (14) capable of executing a write operation including a repetition of a program loop including a program operation and a verify operation. The sense amplifier applies any one of a first voltage (VSS), a second voltage (VQPW1) higher than the first voltage, a third voltage (VQPW2) higher than the second voltage, and a fourth voltage (VHSA) higher than the third voltage to each of the plurality of bit lines while a program voltage (VPGM) is applied to the word line in the program operation.

According to the above embodiment, the semiconductor memory device 1 capable of improving reliability may be provided.

The embodiment is not limited to the above-described mode, and various modifications are possible.

Furthermore, the "connection" in the above embodiment also includes a state of being indirectly connected by interposing something else such as a transistor or a resistor therebetween.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
a memory cell array including a plurality of memory cells;
a word line connected to the plurality of memory cells;
a plurality of bit lines connected respectively to the plurality of memory cells;
a sense amplifier connected to the plurality of bit lines; and
a controller configured to execute a write operation in a plurality of program loops each including a program operation and a verify operation,
wherein the sense amplifier is configured to apply a first voltage, a second voltage higher than the first voltage, a third voltage higher than the second voltage, and a fourth voltage higher than the third voltage to first, second, third, and fourth bit lines of the plurality of bit lines, respectively, while a program voltage is applied to the word line in the program operation.

2. The semiconductor memory device according to claim 1, wherein
the verify operation includes a first verify operation based on a first verify voltage, a second verify operation based on a second verify voltage higher than the first verify voltage, and a third verify operation based on a third verify voltage higher than the second verify voltage, and the plurality of memory cells include first memory cells that are targets of the program operation, having a threshold voltage that is determined to be equal to or less than the first verify voltage in the first verify operation and second memory cells that are targets of the program operation, having a threshold voltage that is determined to exceed the first verify voltage in the first verify operation, and
the second bit lines are respectively connected to the first memory cells having a threshold voltage exceeding the second verify voltage and equal to or less than the third verify voltage, and the third bit lines are respectively connected to the second memory cells having a threshold voltage exceeding the second verify voltage and equal to or less than the third verify voltage.

3. The semiconductor memory device according to claim 2, wherein
the first bit lines are respectively connected to the plurality of memory cells, including the first and second memory cells, that are targets of the write operation, having a threshold voltage lower than the second verify voltage, and
the fourth bit lines are respectively connected to the memory cells that are not targets of the program operation and the first and second memory cells having a threshold voltage higher than the third verify voltage.

4. The semiconductor memory device according to claim 2, wherein
the write operation is carried out to store data of a plurality of bits in each of the plurality of memory cells, and the data stored in each of the plurality of memory cells is determined according to a threshold voltage thereof in relation to a plurality of threshold voltage states, and
the verify operation in each of the program loops is carried out for one of the threshold voltage states, and the first verify voltage corresponding to an $N^{th}$ threshold voltage state (where N is an integer of 2 or more) is equal to the third verify voltage corresponding to an $(N-1)^{th}$ threshold voltage state.

5. The semiconductor memory device according to claim 4, wherein
the first verify operation corresponding to the $N^{th}$ threshold voltage state is based on a result of the third verify operation corresponding to the threshold voltage $(N-1)^{th}$ state during the program loop in which the write operation of the $(N-1)^{th}$ threshold voltage state has completed.

6. The semiconductor memory device according to claim 1, wherein the sense amplifier includes a plurality of sense amplifier circuits, each connected to one of the plurality of bit lines, and each of the sense amplifier circuits includes:
a first transistor having a first end connected to a corresponding bit line and a second end connected to a first node;
a second transistor having a first end connected to the first node and a second end connected to a second node;
a third transistor having a first end connected to the second node and a second end to which a fifth voltage is applied based on data to be written in the memory cell connected to the corresponding bit line;
a fourth transistor having a first end connected to the second node and a second end connected to a third node;
a fifth transistor having a first end connected to the first node; and
a sixth transistor having a first end to which a sixth voltage is applied, a second end connected to a second end of the fifth transistor, and a gate connected to the third node.

7. The semiconductor memory device according to claim 6, wherein, while the program voltage is applied to the word line in the program operation:
the first transistor is turned on;
a seventh voltage based on the second voltage is applied to a gate of the second transistor;
an eighth voltage higher than the seventh voltage is applied to a gate of the third transistor;
the fourth transistor is turned off; and
a ninth voltage, which is based on the third voltage and is higher than the seventh voltage, is applied to a gate of the fifth transistor.

8. The semiconductor memory device according to claim 7, wherein, when the sense amplifier circuit applies the second voltage to the corresponding bit line while the program voltage is applied to the word line in the program operation:
the second transistor is turned on;
the third transistor is turned on, and the fifth voltage that is equal to the fourth voltage is applied to the second end of the third transistor; and the sixth transistor is turned off, and
wherein, when the sense amplifier circuit applies the third voltage to the corresponding bit line while the program voltage is applied to the word line in the program operation:
the second transistor is turned off;
the third transistor is turned on, and the fifth voltage that is equal to the fourth voltage is applied to the second end of the third transistor; and
the sixth transistor is turned on.

9. The semiconductor memory device according to claim 8, wherein, when the sense amplifier circuit applies the first voltage to the corresponding bit line while the program voltage is applied to the word line in the program operation:
the second transistor is turned on;
the third transistor is turned on, and the fifth voltage that is equal to the first voltage is applied to the second end of the third transistor; and
the sixth transistor is turned off, and
wherein, when the sense amplifier circuit applies the fourth voltage to the corresponding bit line while the program voltage is applied to the word line in the program operation:
the second transistor and the fifth transistor are turned off.

10. The semiconductor memory device according to claim 6, further comprising a voltage generation circuit configured to supply a voltage to the sense amplifier,
wherein the voltage generation circuit includes:
a current source having an output terminal connected to a fourth node;
a first variable resistance element having a first end connected to the fourth node and a second end connected to a fifth node; and
a second variable resistance element having a first end connected to the fifth node and a second end connected to a sixth node, and
wherein, while the program voltage is applied to the word line in the program operation, the voltage generation circuit applies a voltage of the fourth node to a gate of the fifth transistor, applies a voltage of the fifth node to a gate of the third transistor, and applies a voltage of the sixth node to a gate of the second transistor.

11. A semiconductor memory device comprising:
a memory cell array including a plurality of memory cells;
a word line connected to the plurality of memory cells;
a plurality of bit lines connected respectively to the plurality of memory cells;
a sense amplifier including a plurality of sense amplifiers circuits respectively connected to the plurality of bit lines; and
a controller configured to execute a write operation in a plurality of program loops each including a program operation and a verify operation,
wherein each of the sense amplifier circuits includes:
a first transistor having a first end connected to a corresponding bit line and a second end connected to a first node;
a second transistor having a first end connected to the first node and a second end connected to a second node;
a third transistor having a first end connected to the second node and a second end to which a first voltage or a second voltage lower than the first voltage is applied based on data to be written in the memory cell connected to the corresponding bit line;

a fourth transistor having a first end connected to the second node and a second end connected to a third node;

a fifth transistor having a first end connected to the first node; and a sixth transistor having a first end to which the first voltage is applied, a second end connected to a second end of the fifth transistor, and a gate connected to the third node.

12. The semiconductor memory device according to claim 11, wherein each of the sense amplifier circuits further includes:

a seventh transistor having a first end connected to the third node and a fourth node connected to a sense node;

an eighth transistor having a first end to which the second voltage is applied and a gate connected to the sense node; and a ninth transistor having a first end connected to a second end of the eighth transistor and a second end connected to a latch circuit that stores the data to be written in the memory cell connected to the corresponding bit line.

13. The semiconductor memory device according to claim 12, further comprising a voltage generation circuit configured to supply a voltage to the sense amplifier, wherein the voltage generation circuit includes:

a current source having an output terminal connected to a fourth node;

a first variable resistance element having a first end connected to the fourth node and a second end connected to a fifth node; and a second variable resistance element having a first end connected to the fifth node and a second end connected to a sixth node, and wherein, while a program voltage is applied to the word line in the program operation, the voltage generation circuit applies a voltage of the fourth node to a gate of the fifth transistor, applies a voltage of the fifth node to a gate of the third transistor, and applies a voltage of the sixth node to a gate of the second transistor.

14. The semiconductor memory device according to claim 12, wherein the voltage generation circuit further includes:

a first selector circuit between the fourth node and the gate of the fifth transistor;

a second selector circuit between the fifth node and the gate of the third transistor;

a third selector circuit between the sixth node and the gate of the second transistor, and wherein the controller is configured to change settings of the first, second, and third selector circuits during the program operation.

15. A method of performing a write operation in semiconductor memory device that includes a memory cell array including a plurality of memory cells, a word line connected to the plurality of memory cells, a plurality of bit lines connected respectively to the plurality of memory cells, and a sense amplifier connected to the plurality of bit lines, wherein the write operation is executed in a plurality of program loops each including a program operation and a verify operation, said method comprising:

while a program voltage is applied to the word line in the program operation, applying a first voltage, a second voltage higher than the first voltage, a third voltage higher than the second voltage, and a fourth voltage higher than the third voltage to first, second, third, and fourth bit lines of the plurality of bit lines, respectively.

16. The method according to claim 15, wherein the verify operation includes a first verify operation based on a first verify voltage, a second verify operation based on a second verify voltage higher than the first verify voltage, and a third verify operation based on a third verify voltage higher than the second verify voltage, and the plurality of memory cells include first memory cells that are targets of the program operation, having a threshold voltage that is determined to be equal to or less than the first verify voltage in the first verify operation and second memory cells that are targets of the program operation, having a threshold voltage that is determined to exceed the first verify voltage in the first verify operation, and the second bit lines are respectively connected to the first memory cells having a threshold voltage exceeding the second verify voltage and equal to or less than the third verify voltage, and the third bit lines are respectively connected to the second memory cells having a threshold voltage exceeding the second verify voltage and equal to or less than the third verify voltage.

17. The method according to claim 16, wherein the first bit lines are respectively connected to the plurality of memory cells, including the first and second memory cells, that are targets of the write operation, having a threshold voltage lower than the second verify voltage, and the fourth bit lines are respectively connected to the memory cells that are not targets of the program operation and the first and second memory cells having a threshold voltage higher than the third verify voltage.

18. The method according to claim 16, wherein the write operation is carried out to store data of a plurality of bits in each of the plurality of memory cells, and the data stored in each of the plurality of memory cells is determined according to a threshold voltage thereof in relation to a plurality of threshold voltage states, and the verify operation in each of the program loops is carried out for one of the threshold voltage states, and the first verify voltage corresponding to an $N^{th}$ threshold voltage state (where N is an integer of 2 or more) is equal to the third verify voltage corresponding to an $(N-1)^{th}$ threshold voltage state.

19. The method according to claim 18, wherein the first verify operation corresponding to the $N^{th}$ threshold voltage state is based on a result of the third verify operation corresponding to the threshold voltage $(N-1)^{th}$ state during the program loop in which the write operation of the $(N-1)^{th}$ threshold voltage state has completed.

20. The method according to claim 15, wherein the verify operation of each program loop in a first set of the program loops includes a first verify operation based on a first verify voltage, a second verify operation based on a second verify voltage higher than the first verify voltage, and a third verify operation based on a third verify voltage higher than the second verify voltage, and the verify operation of each program loop in a second set of the program loops, all of which are executed prior to the program loops in the first set, includes the second verify operation and the third verify operation, but not the first verify operation.

\* \* \* \* \*